United States Patent
Yen et al.

(10) Patent No.: US 12,283,618 B2
(45) Date of Patent: Apr. 22, 2025

(54) INNER SPACER FOR SEMICONDUCTOR DEVICE

(71) Applicant: TAIWAN SEMICONDUCTOR MANUFACTURING COMPANY, LTD., Hsinchu (TW)

(72) Inventors: Fu-Ting Yen, Hsinchu (TW); Kuei-Lin Chan, Hsinchu (TW); Yu-Yun Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 420 days.

(21) Appl. No.: 17/716,192

(22) Filed: Apr. 8, 2022

(65) Prior Publication Data

US 2023/0326988 A1    Oct. 12, 2023

(51) Int. Cl.
| | |
|---|---|
| H01L 29/423 | (2006.01) |
| H01L 21/3115 | (2006.01) |
| H01L 21/8234 | (2006.01) |
| H01L 29/06 | (2006.01) |
| H01L 29/417 | (2006.01) |
| H01L 29/66 | (2006.01) |
| H01L 29/786 | (2006.01) |

(52) U.S. Cl.
CPC .. *H01L 29/42392* (2013.01); *H01L 21/31155* (2013.01); *H01L 21/823412* (2013.01); *H01L 21/823418* (2013.01); *H01L 21/823437* (2013.01); *H01L 29/0665* (2013.01); *H01L 29/41775* (2013.01); *H01L 29/66553* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 2019/0131431 A1* | 5/2019 | Cheng | H01L 29/66439 |
| 2020/0168722 A1* | 5/2020 | Hung | H01L 21/3247 |
| 2020/0227534 A1* | 7/2020 | Chiang | H01L 21/0245 |

* cited by examiner

*Primary Examiner* — Bo B Jang
(74) *Attorney, Agent, or Firm* — Birch, Stewart, Kolasch & Birch, LLP

(57) ABSTRACT

A device includes at least one semiconductor unit which includes a first source/drain portion, a second source/drain portion, at least one nanosheet segment which is disposed to interconnect the first and second source/drain portions, a gate portion disposed around the at least one nanosheet segment, and a first inner spacer portion and a second inner spacer portion which are disposed to separate the gate portion from the first and second source/drain portions, respectively. Each of the first and second inner spacer portions has a carbon-rich region which confronts the gate portion.

20 Claims, 21 Drawing Sheets

INNER SPACER FOR SEMICONDUCTOR DEVICE

BACKGROUND

The semiconductor integrated circuit (IC) industry has, over the decades, experienced tremendous advancements and is still undergoing vigorous development. With dramatic advances in technology, the industry pays much attention on the development of small IC devices with high performance and low cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
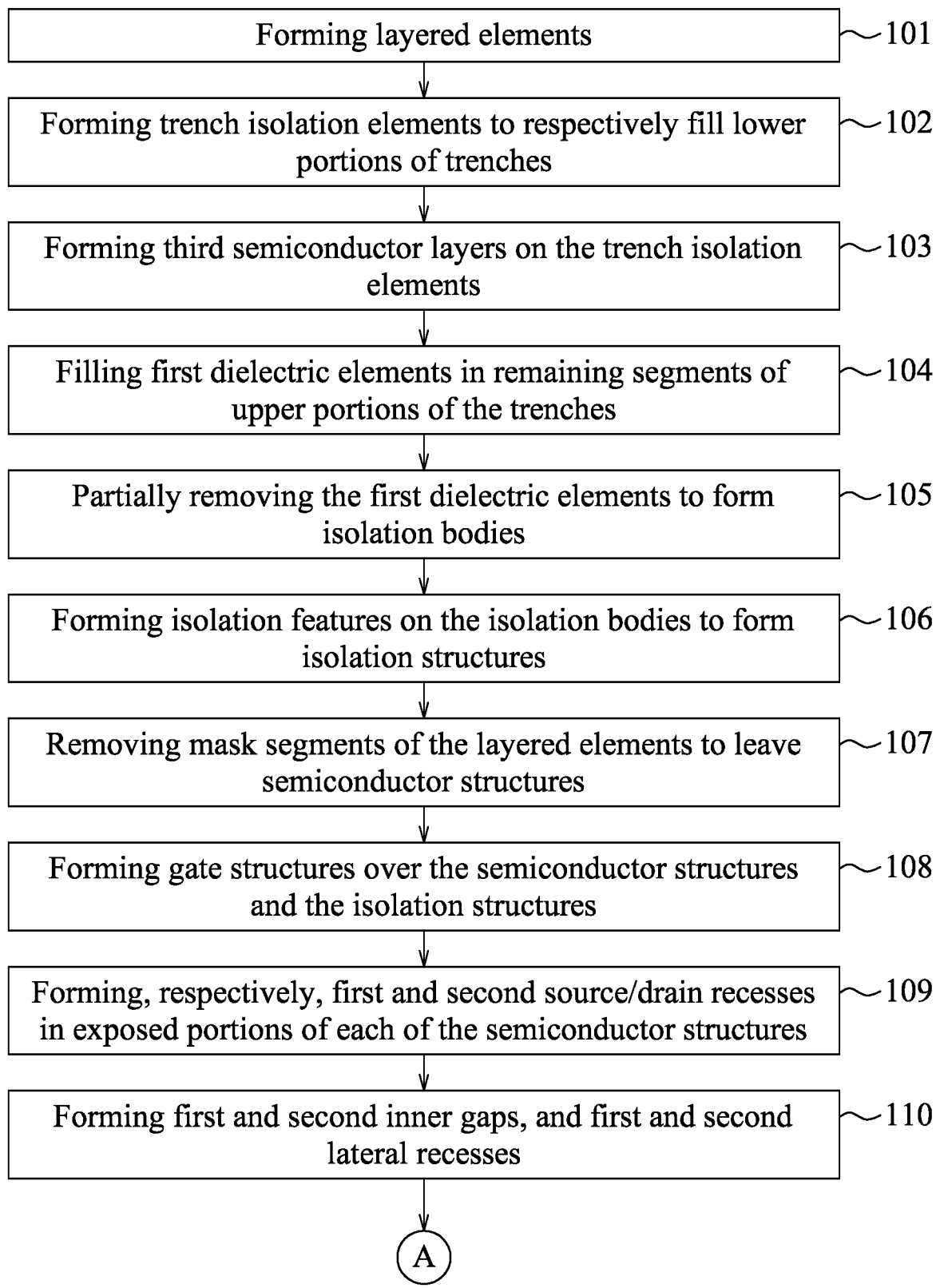
FIG. 1A is a flow diagram of a method for making a device in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "below," "upper," "lower," "uppermost," "lowermost," "inner," "outer," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
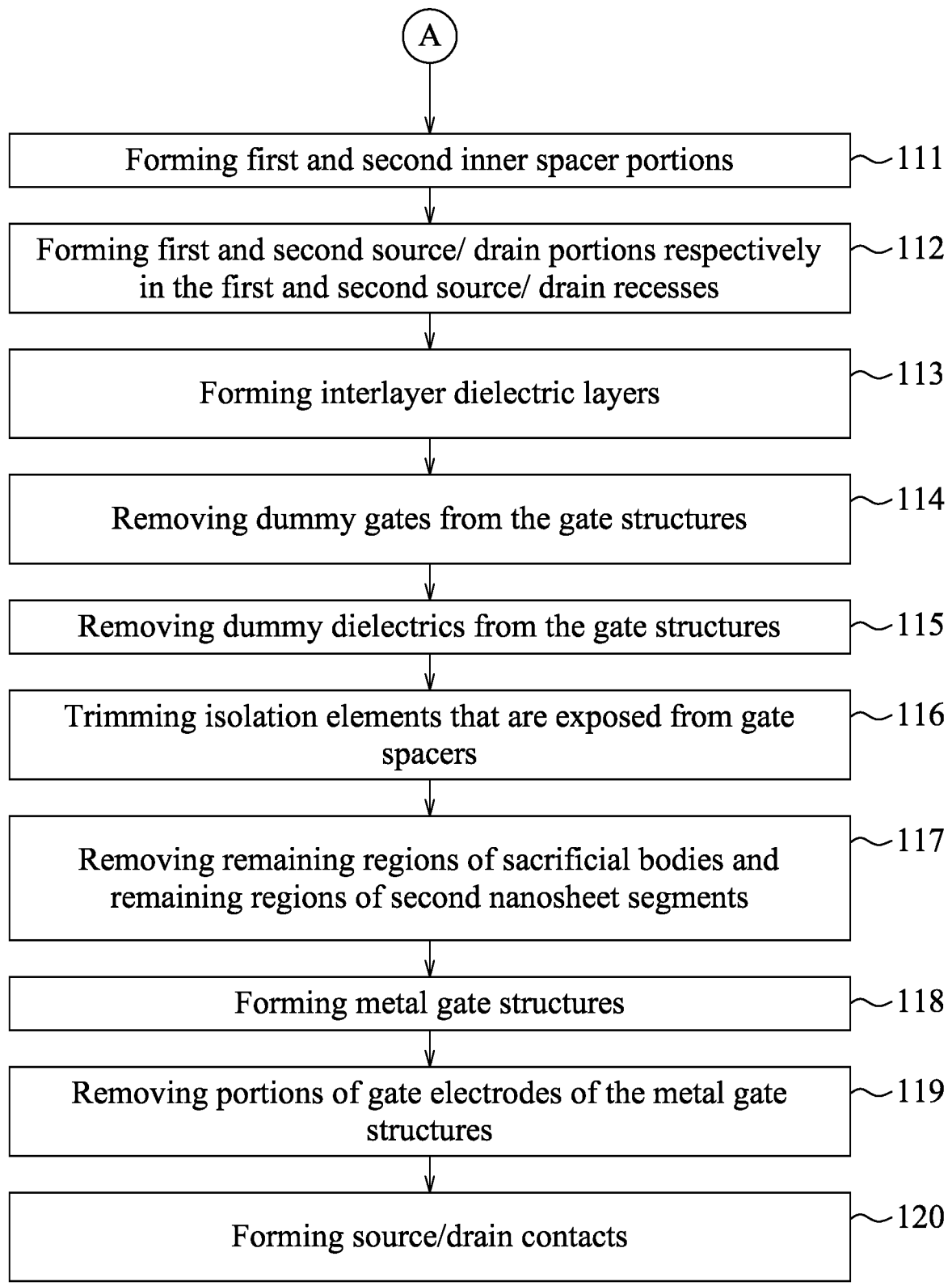
FIG. 1B is a continuation of the flow diagram of the method shown in FIG. 1A.

The present disclosure is directed to a device and a method for manufacturing the same. The device may be, for example, but not limited to, a memory device, a multi-gate device, or other suitable devices. FIGS. 1A and 1B are flow diagrams illustrating a method for manufacturing the device (for example, but not limited to, a device 200 shown in FIG. 21A) in accordance with some embodiments. FIGS. 2A to 21D illustrate schematic views of intermediate stages of the method. Some repeating structures are omitted in FIGS. 2A to 21D for the sake of brevity. Additional steps can be provided before, after or during the method, and some of the steps described herein may be replaced by other steps or be eliminated. In the exemplary method according to the present disclosure, the device 200 is a multi-gate device. The device 200 has at least one semiconductor unit 300, and two of the semiconductor units 300 are shown in FIG. 21A.

Figure 2B:
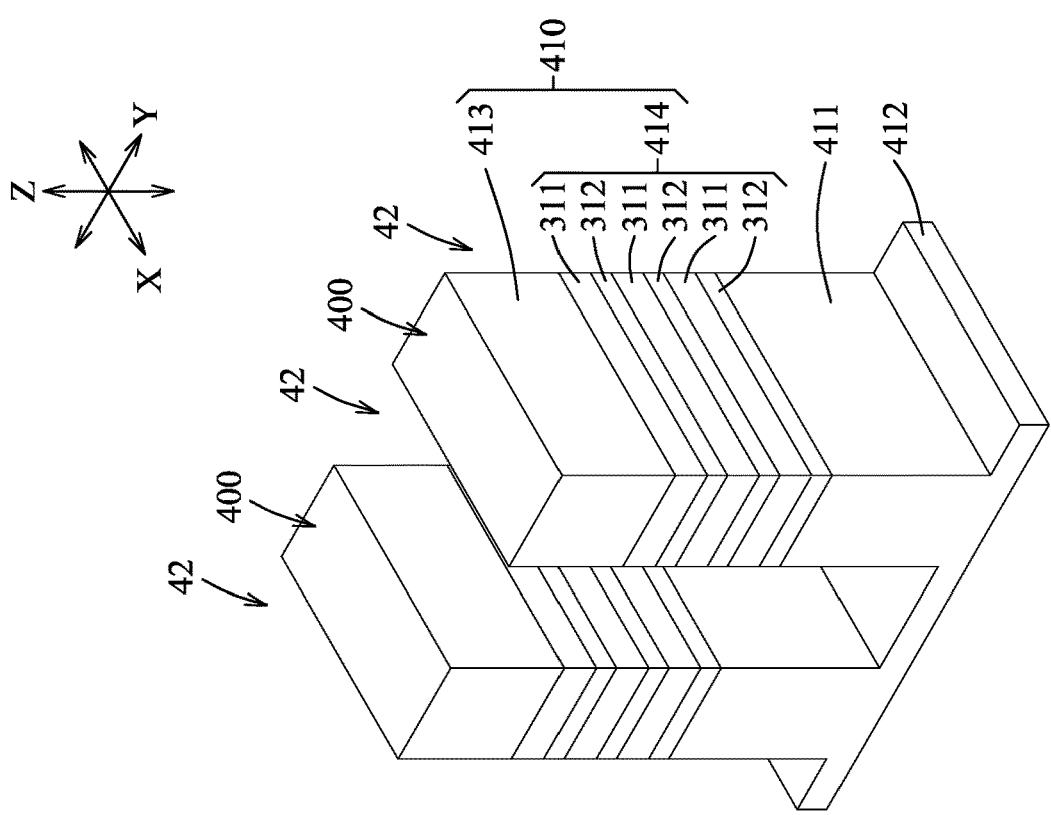
FIGS. 2A to 13B, and 14A to 21D are schematic views illustrating intermediate stages of the method in accordance with some embodiments of the present disclosure.
Figure 2A:
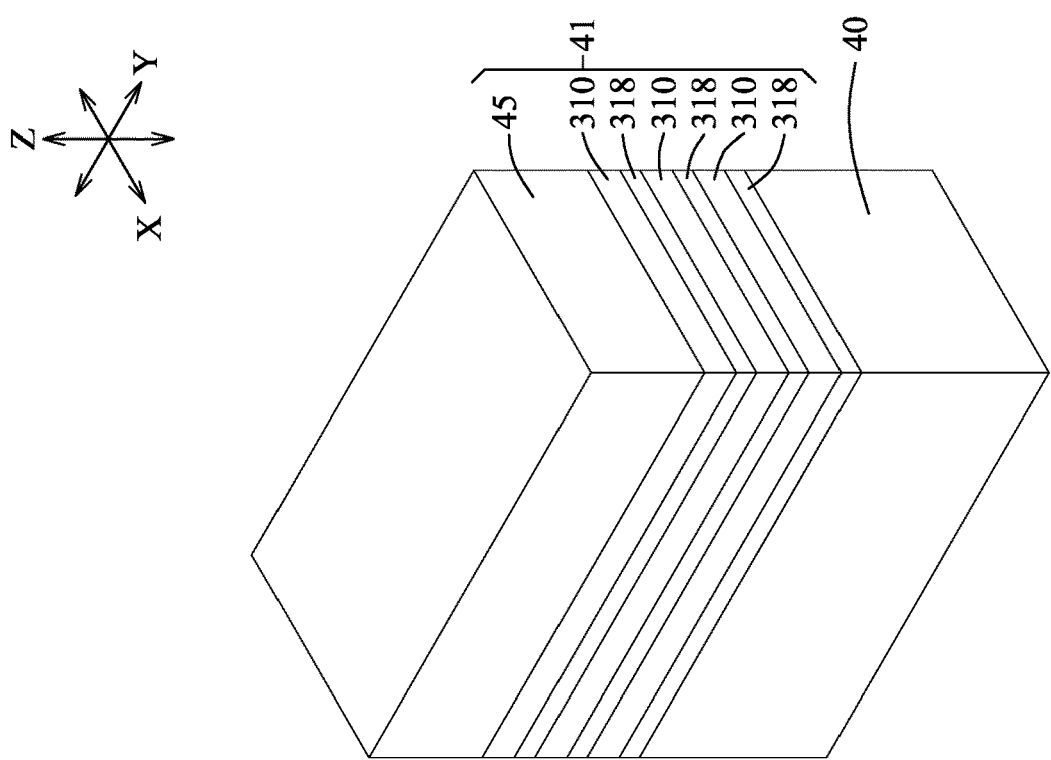

Referring to FIG. 1A and the examples illustrated in FIGS. 2A and 2B, the method begins at step 101, where a layered element 400 is formed. In this embodiment, as shown in FIG. 2B, two of the layered elements 400 are formed by patterning a stack of semiconductor layers 41 (hereinafter referred to as the stack 41) disposed on a substrate 40 and etching back the substrate 40. The substrate 40 and the stack 41 are shown in FIG. 2A.

The stack 41 has at least one first semiconductor layer 310 including a first semiconductor material, and at least one second semiconductor layer 318 disposed to alternate with the first semiconductor layer 310 and including a second semiconductor material. An uppermost one of the at least one first semiconductor layer 310 is disposed over an uppermost one of the at least one second semiconductor layer 318 such that an uppermost one of semiconductor layers in the stack 41 is the uppermost one of the at least one of the first semiconductor layer 310. In some embodiments, a lowermost one of the at least one second semiconductor layer 318 is disposed below a lowermost one of the at least one first semiconductor layer 310 such that a lowermost one of semiconductor layers in the stack 41 is the lowermost one of the at least one of the second semiconductor layer 318. The first and second semiconductor materials have different etch selectivity and/or oxidation rates. In some embodiments, the first semiconductor material may be the same material as that of the substrate 40. The first semiconductor layer 310 and the second semiconductor layer 318 may be intrinsic or doped with a p-type dopant or an n-type dopant. In some embodiments, the first semiconductor material is silicon, and the second semiconductor material is silicon germanium (SiGe). Other materials suitable for the first semiconductor layer 310 and the second semiconductor layer 318 are within the contemplated scope of the present disclosure. In some embodiments, the stack 41 has a plurality of the first semiconductor layers 310 and a plurality of the second semiconductor layers 318. The numbers of the first and second semiconductor layers 310, 318 in the stack 41 are determined according to application requirements. In FIG. 2A, the stack 41 has three first semiconductor layers 310 and three second semiconductor layers 318. The first and second semiconductor layers 310, 318 may have the same thickness or different thicknesses in the Z direction. In FIG. 2A, the thickness of the first semiconductor layer 310 is substantially the same as the thickness of the second semiconductor layer 318.

In some embodiments, the substrate 40 may be, for example, but not limited to, a silicon-on-insulator (SOI) substrate, a germanium-on-insulator (GOI) substrate, a bulk semiconductor substrate, or the like. The substrate 40 may have multiple layers. The substrate 40 may include, for example, elemental semiconductor materials, such as crystalline silicon, diamond, or germanium; compound semiconductor materials, such as silicon carbide, gallium arsenic, indium arsenide, gallium phosphide, indium arsenide, indium phosphide, or indium antimonide; alloy semiconductor materials, such as silicon germanium, silicon germanium carbide, gallium arsenic phosphide, aluminum gallium arsenide, or gallium indium phosphide; or combinations thereof. The substrate 40 may be intrinsic or doped with a dopant or different dopants. Other materials suitable for the substrate 40 are within the contemplated scope of the present disclosure. In some embodiments, the substrate 40 is a bulk silicon substrate.

Each of the first semiconductor layers 310 and the second semiconductor layers 318 in the stack 41 may be formed on the substrate 40 by a suitable fabrication technique, for example, chemical vapor deposition (CVD), metalorganic CVD (MOCVD), plasma-enhanced CVD (PECVD), molecular-beam epitaxy (MBE), vapor-phase epitaxy (VPE), low-pressure CVD (LPCVD), ultra-high vacuum CVD (UHV-CVD), physical vapor deposition (PVD), atomic layer deposition (ALD), remote plasma atomic layer deposition (RPALD), plasma-enhanced atomic layer deposition (PEALD), molecular-beam deposition (MBD), or the like, or combinations thereof. Other suitable techniques for forming the first semiconductor layers 310 and the second semiconductor layers 318 are within the contemplated scope of the present disclosure.

In some embodiments, the stack 41 further has a mask layer 45 disposed on the uppermost one of the first semiconductor layers 310 (as shown in FIG. 2A). The mask layer 45 may include, for example, but not limited to, a dielectric material, such as a nitride (e.g., SiN), an oxide (e.g., SiOx), or the like, or combinations thereof. Other materials suitable for the mask layer 45 are within the contemplated scope of the present disclosure. The mask layer 45 may have multiple sub-layers. In certain embodiments, the mask layer 45 is a patterned mask layer.

In FIG. 2B, the stack 41 and the substrate 40 are patterned to form the layered elements 400 by removing portions of the stack 41 and the substrate 40. After performing patterning of the stack 41 in step 101, trenches 42 are formed to separate the layered elements 400. Each of the layered elements 400 includes a stack segment 410 formed from patterning of the stack 41, and a substrate segment 411 formed from patterning of the substrate 40. A remaining portion of the substrate 40 that is not patterned forms a residual substrate segment 412. In certain embodiments, the stack segment 410 includes a nanosheet stack 414 which includes at least one first nanosheet 311 and at least one second nanosheet 312 alternating with the at least one first nanosheet 311. In some embodiments, the nanosheet stack 414 includes a plurality of the first nanosheets 311 and a plurality of the second nanosheets 312. The first nanosheets 311 are formed from patterning of the first semiconductor layers 310 in the stack 41, and the second nanosheets 312 are formed from patterning of the second semiconductor layers 318 in the stack 41. In some embodiments, the stack segment 410 further includes a mask segment 413 which is formed on the nanosheet stack 414 and which is formed from patterning of the mask layer 45 in the stack 41. In certain embodiments, each of the layered elements 400 is a fin structure. The patterning of the stack 41 and the substrate 40 may be performed using any suitable etching process, for example, but not limited to, dry etching, wet etching, reactive ion etching (RIE), or the like, or combinations thereof. The etching process may be an anisotropic etching process. In some embodiments, the etching process may use an etch gas such as a nitrogen-containing etch gas (e.g., $NH_3$), a halogen-containing etch gas (for example, a chlorine-containing etch gas such as $Cl_2$, $SiCl_4$, $BCl_3$, $CHCl_3$, $CCl_4$, or the like, a fluorine-containing etch gas such as $F_2$, $NF_3$, $C_xF_y$, $CH_xF_y$, HF, $SF_6$, or the like), a hydrogen-containing etch gas (e.g., $H_2$), or the like, or combinations thereof, but not limited thereto. The etching process may use a carrier gas to deliver the etch gas. The etching process may use a solution containing a wet etchant (i.e., a wet etchant solution). The wet etchant solution may include $NH_4OH$, $H_2SO_4$, $H_2O_2$, HCl, $H_2O$, HF, $HNO_3$, diluted HF, $O_3$, $H_3PO_4$, or the like, or combinations thereof. In certain embodiments, the etching process may be a timed process so that etching is stopped after a period of time when desired portions of the stack 41 and/or the substrate 40 is removed. Before the etching process, a photoresist may be developed using a lithography process which may include the following sub-steps: (i) forming a photoresist (not shown) to cover the stack 41, and (ii) patterning the photoresist such that the photoresist forms into a patterned photoresist. The photoresist may be formed by spin coating. Patterning of the photoresist may be performed using a photomask or without a mask (e.g., ion-beam writing). The etching process uses the patterned photoresist as an etch mask to pattern the stack 41 and the substrate 40. After the etching process, the patterned photoresist is removed by, for example, a stripping process. Other suitable processes for removing the patterned photoresist are within the contemplated scope of the present disclosure. Patterning of the stack 41 and the substrate 40 may include multiple etching processes so that the layered elements 400 are formed according to application requirements. Other suitable processes for patterning the stack 41 and the substrate 40 are within the contemplated scope of the present disclosure.

In some embodiments, a dielectric liner (not shown) may be formed over the structure shown in FIG. 2B using CVD, PVD, ALD, or other suitable processes to enhance the performance of the device 200 obtained using the method according to the disclosure. The dielectric liner includes silicon oxide, silicon nitride, or a combination thereof. Other suitable processes and materials for forming the dielectric liner are within the contemplated scope of the present disclosure.

Figure 3:
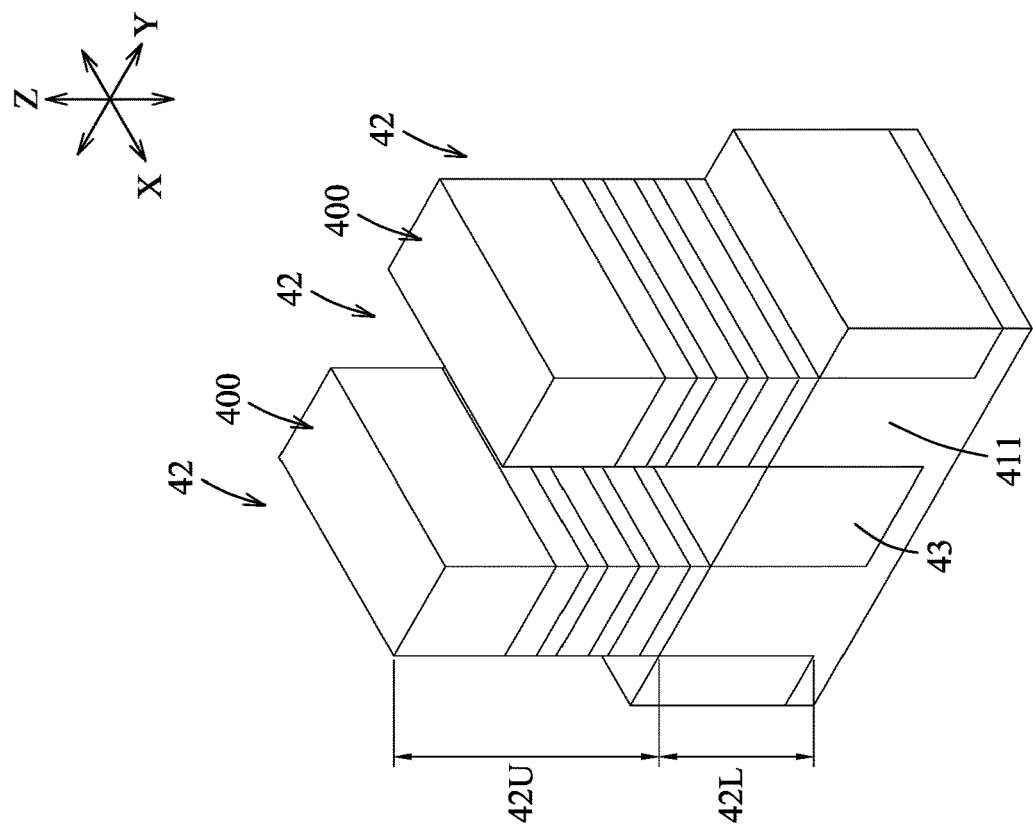

Referring to FIG. 1A and the examples illustrated in FIG. 3, the method proceeds to step 102, where trench isolation elements 43 are formed to respectively fill lower portions 42L of the trenches 42. To form the trench isolation elements 43, first, a first isolation material is filled in the trenches 42 by, for example, a deposition process, such as CVD, PECVD, FCVD (flowable CVD), or other suitable techniques. Thereafter, the first isolation material is planarized to remove an excess thereof such that the first isolation material is flush with upper surfaces of the layered elements 400. The planarization process may be a chemical-mechanical planarization (CMP) process, other suitable techniques, or combinations thereof. Then, the first isolation material is etched back using, for example, a dry etching process, but is not limited thereto, so as to obtain the trench isolation elements 43. In FIG. 3, upper surfaces of the trench isolation elements 43 are located at substantially the same level as the upper surfaces of the substrate segments 411 of the layered elements 400. The trench isolation elements 43 may serve as shallow trench isolations (STI) to alternate with the layered elements 400. The trench isolation elements 43 may include an oxide material, such as silicon oxide, but is not limited thereto. Other materials and processes suitable for forming the trench isolation elements 43 are within the contemplated scope of the present disclosure.

Figure 4:
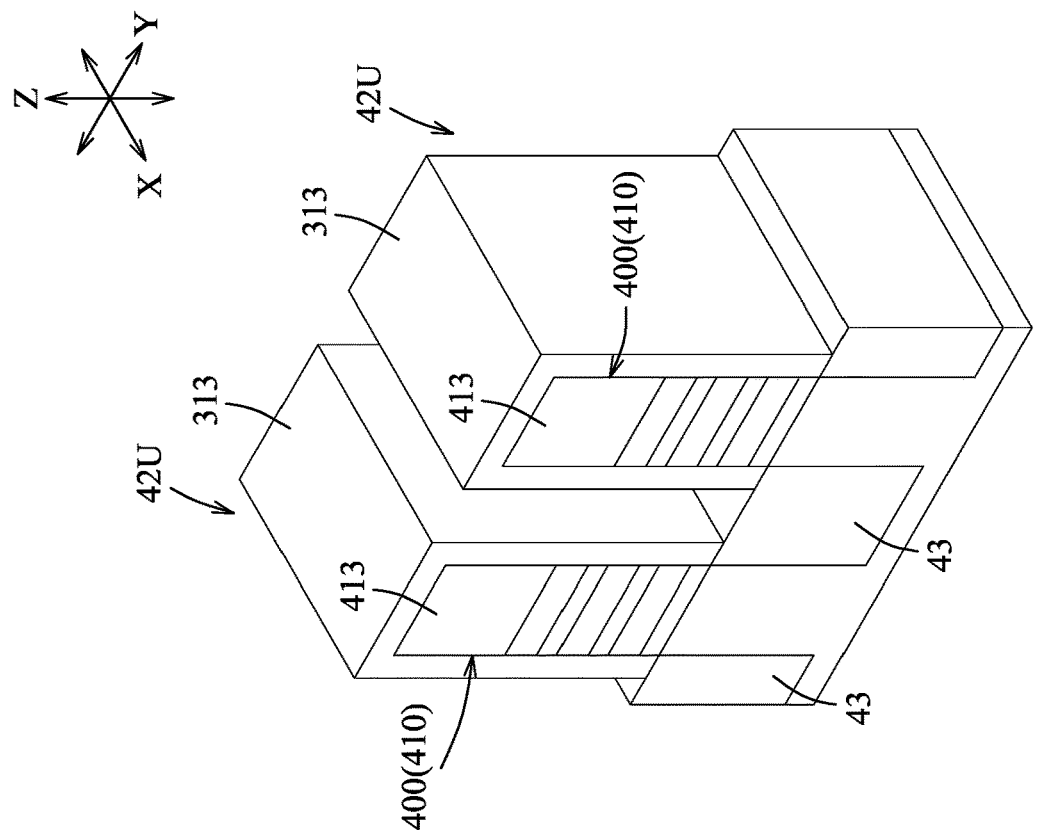

Referring to FIG. 1A and the examples illustrated in FIG. 4, the method proceeds to step 103, where third semiconductor layers 313 are formed on the trench isolation elements 43 to respectively wrap the stack segments 410 of the layered elements 400. In FIG. 4, the third semiconductor layers 313 are partially located in upper portions 42U of the trenches 42 and are spaced apart from each other.

The third semiconductor layers 313 may be formed by suitable fabrication techniques such as CVD, ALD, PVD, PECVD, or the like, or combinations thereof, and may include, for example, but not limited to, silicon germanium, or the like. Other suitable techniques and materials for forming the third semiconductor layers 313 are within the contemplated scope of the present disclosure. In some embodiments, the third semiconductor layers 313 may be made of a material same as that of the second semiconductor layers 318.

Figure 5:
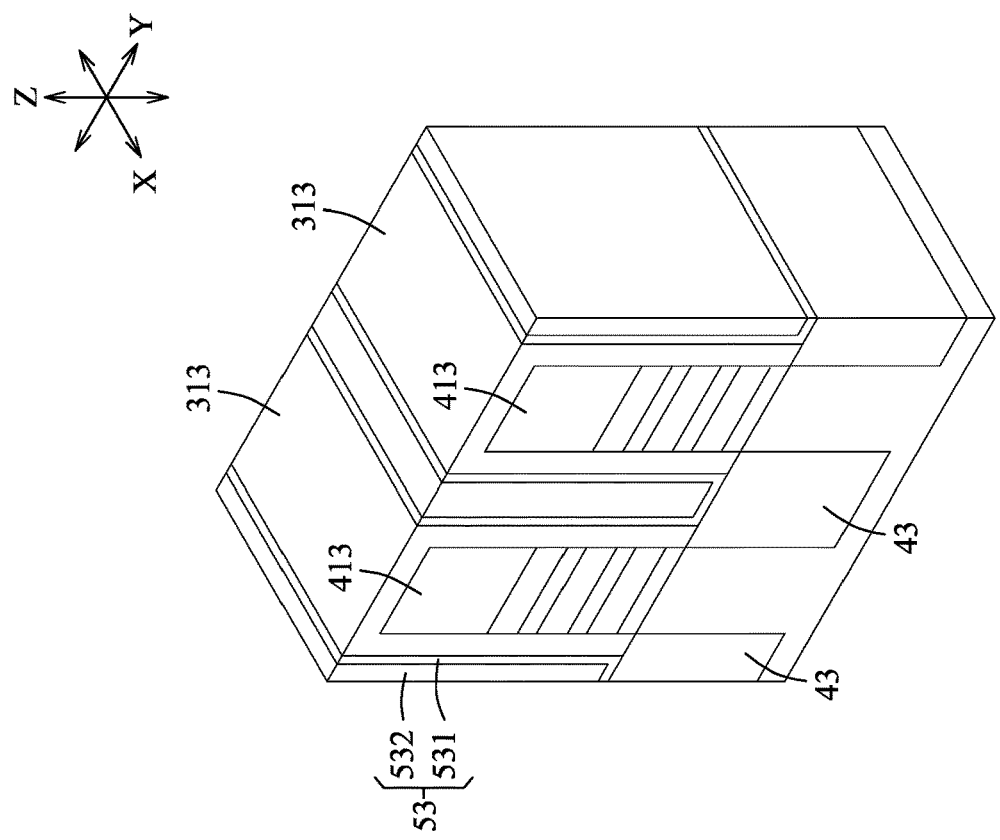

Referring to FIG. 1A and the examples illustrated in FIGS. 4 and 5, the method proceeds to step 104, where first dielectric elements 53 are respectively filled in the remaining segments of the upper portions 42U of the trenches 42.

In some embodiments, each of the first dielectric elements 53 may include a first dielectric film 531 and a first dielectric body 532. The first dielectric film 531 is formed between the first dielectric body 532 and the third semiconductor layers 313 (as shown in FIG. 5). In certain embodiments, the first dielectric film 531 and the first dielectric body 532 are made of different materials. In some embodiments, step 104 may include the following sub-steps: (i) conformally depositing a first dielectric layer, which is for forming the first dielectric film 531, on the third semiconductor layers 313 and on the trench isolation elements 43 exposed from the remaining segments of the upper portions 42U of the trenches 42, (ii) forming a second dielectric layer, which is for forming the first dielectric body 532, on the first dielectric layer until the remaining segments of the upper portions 42U of the trenches 42 are filled, and (iii) removing an excess of the first dielectric layer and the second dielectric layer to expose the third semiconductor layers 313, to thereby form the first dielectric elements 53. The first dielectric layer may be formed using suitable fabrication techniques such as ALD, CVD, PVD, HDPCVD, MOCVD, RPCVD, PECVD, APCVD, SAVCD, or the like, or combinations thereof. The second dielectric layer may be formed using suitable fabrication techniques such as LPCVD, FCVD, HPCVD, HARP, CVD, or the like, or combinations thereof. Removal of the excess of the first and second dielectric layers may be performed using a planarization process, such as CMP, or the like. Other suitable techniques for forming the first dielectric elements 53 are within the contemplated scope of the present disclosure.

The first dielectric film 531 includes a low-k dielectric material having a dielectric constant (k) of not greater than about 7. In some embodiments, the low-k dielectric material of the first dielectric film 531 has a dielectric constant (k) of not greater than about 5. In certain embodiments, the first dielectric film 531 may include, for example, a silicon-based dielectric material such as silicon oxide, silicon nitride, silicon oxycarbide, or the like, but not limited thereto. The first dielectric film 531 may be intrinsic or doped with a p-type dopant and/or an n-type dopant. The first dielectric body 532 may include an oxide material such as silicon oxide, or the like, but not limited thereto. The oxide material of the first dielectric body 532 may be the same as the oxide material of the trench isolation elements 43.

Figure 6:
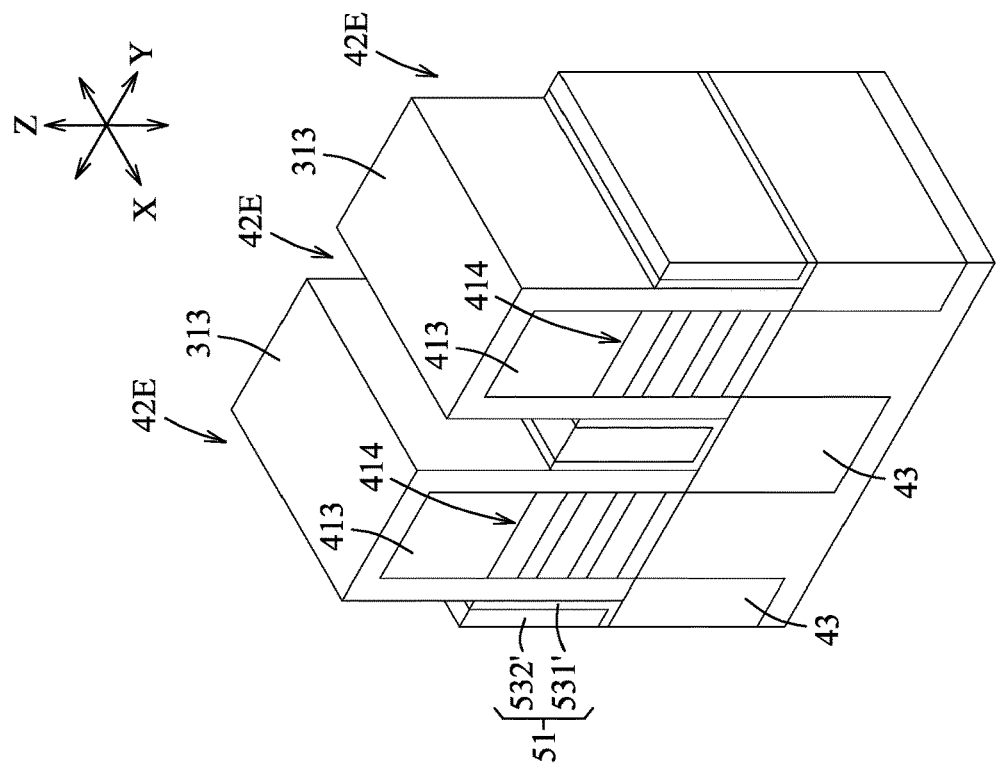

Referring to FIG. 1A and the examples illustrated in FIGS. 5 and 6, the method proceeds to step 105, where the first dielectric elements 53 are partially removed to form isolation bodies 51. After step 105, etching recesses 42E are formed, a remaining part of the first dielectric film 531 is denoted by the numeral 531', and a remaining part of the first dielectric body 532 is denoted by the numeral 532'.

In some embodiments, after step 105, upper surfaces of the isolation bodies 51 are at a level substantially the same as upper surfaces of the nanosheet stacks 414 with respect to upper surfaces of the trench isolation elements 43. In some embodiments, step 105 is performed by an etching process, for example, but not limited to, dry etching, wet etching, other suitable techniques, or combinations thereof. The etching process selectively removes the first dielectric elements 53 with respect to the third semiconductor layers 313. That is, the etching process implements an etchant that has a high etch selectivity for dielectric materials (i.e., the first dielectric elements 53) compared to semiconductor materials (i.e., the third semiconductor layers 313) so that the third semiconductor layers 313 are not or are not substantially removed during step 105. In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve selective removal of the first dielectric elements 53.

Figure 7:
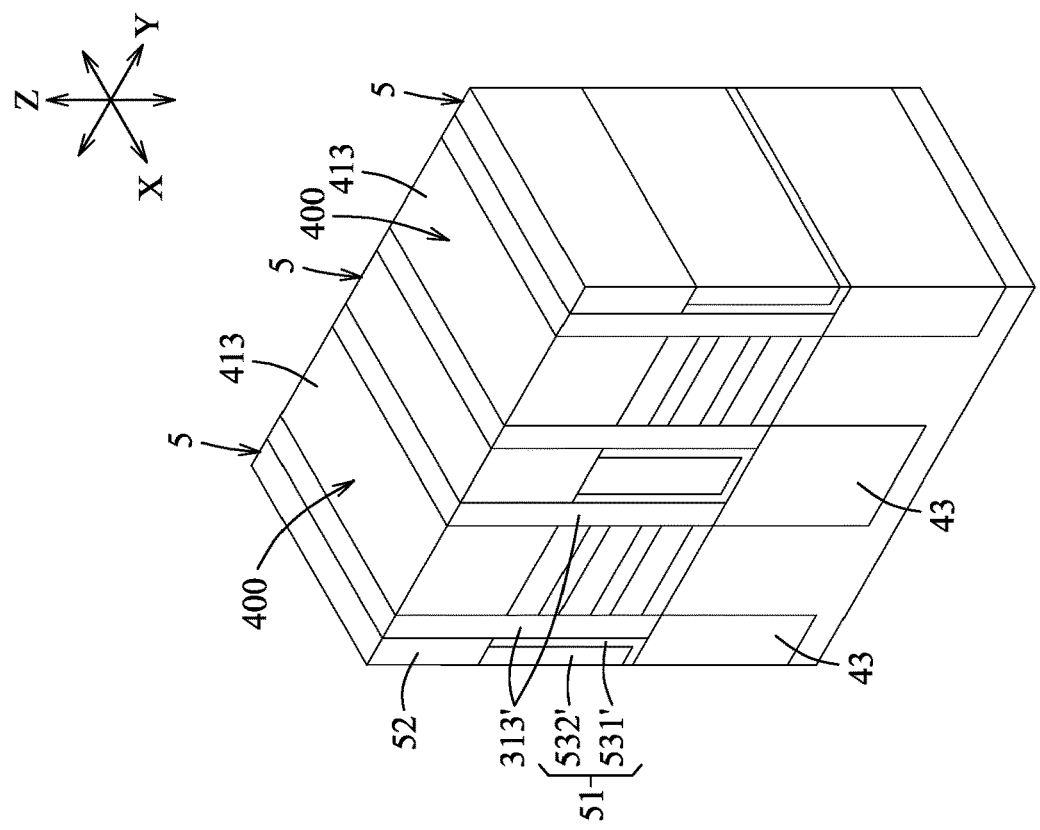

Referring to FIG. 1A and the examples illustrated in FIGS. 6 and 7, the method proceeds to step 106, where isolation features 52 are formed on the isolation bodies 51 to respectively refill the etching recesses 42E, thereby obtaining isolation structures 5 each including one of the isolation features 52 and a corresponding one of the isolation bodies 51. As shown in FIG. 7, one of the isolation features 5 is disposed between and separates the layered elements 400. The isolation features 52 have a dielectric constant greater than that of the isolation bodies 51.

In some embodiments, step 106 may include the following sub-steps: (i) depositing a third dielectric layer, which is for forming the isolation features 52, on the third semiconductor layers 313 and the isolation bodies 51 to refill the etching recesses 42E, and (ii) removing portions of the third semiconductor layers 313 and a portion of the third dielectric layer to expose the layered elements 400. The remaining portion of the third dielectric layer forms the isolation features 52. The third dielectric layer may be formed by suitable fabrication techniques, such as ALD, PVD, CVD, FCVD, or other suitable techniques, but not limited thereto. In some embodiments, the third dielectric layer is formed by PVD.

Removal of the portions of the third semiconductor layers 313 and the portion of the third dielectric layer may be performed using a planarization process, for example, CMP, or other suitable processes, or combinations thereof, to permit an upper surface of the planarized third dielectric layer to be flush with an upper surface of the planarized third semiconductor layers 313 (as shown in FIGS. 6 and 7). In some embodiments, as shown in FIG. 7, after the planarization process, an upper surface of the mask segment 413 of each of the layered elements 400 is exposed. Other suitable planarization processes for forming the isolation features 52 are within the contemplated scope of the present disclosure. After step 106, the third dielectric layer forms into the isolation features 52, and each of the third semiconductor layers 313 forms into two sacrificial segments 313' that are disposed on two opposite sides of a corresponding one of the layered elements 400. In certain embodiments, upper surfaces of the isolation features 52 are flush with the upper surfaces of the mask segments 413 of the first and second layered elements 400, 401.

Figure 8:
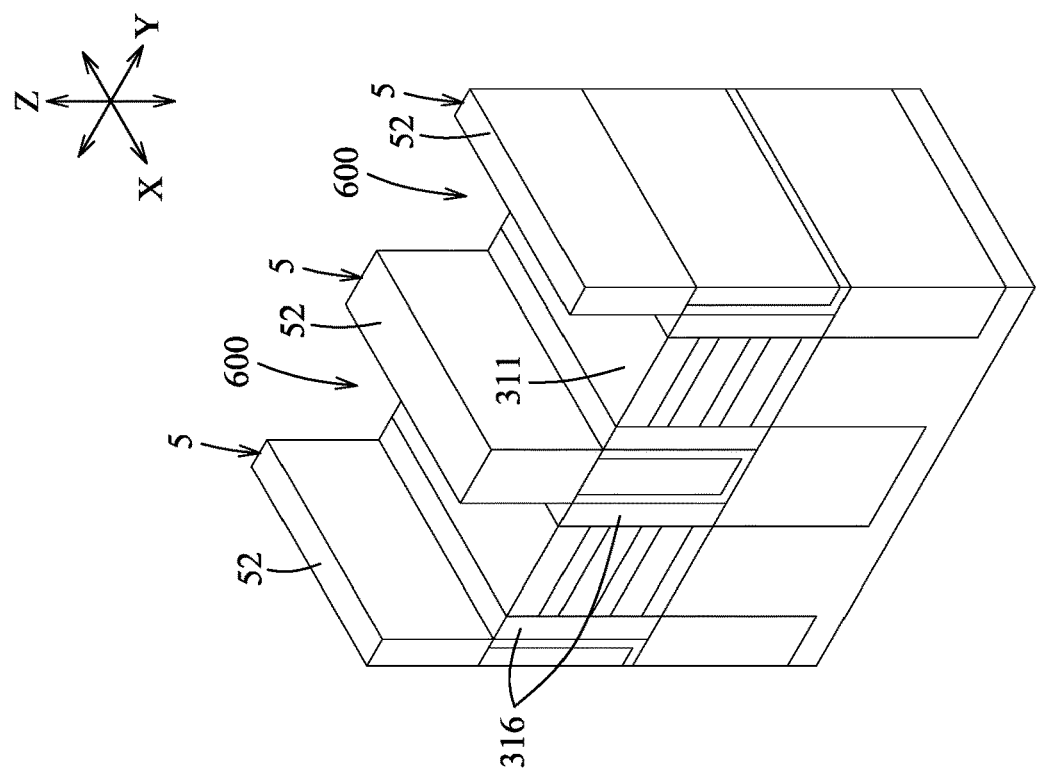

Referring to FIG. 1A and the examples illustrated in FIGS. 7 and 8, the method proceeds to step 107, where the mask segments 413 of the layered elements 400 are removed to leave semiconductor structures 600. In addition, in step 107, upper parts of the sacrificial segments 313' are removed to form sacrificial portions 316 disposed on opposite sides of each of the semiconductor structures 600. In some embodiments, each of the semiconductor structures 600 is a nanosheet structure. In FIG. 8, after step 107, an uppermost one of the first nanosheets 311 in each of the semiconductor structures 600 is exposed. In addition, upper surfaces of the sacrificial portions 316 are at a level substantially the same as upper surfaces of the semiconductor structures 600 and thus, side surfaces of the isolation features 52 are exposed after step 107.

In some embodiments, step 107 may be performed by an etching process, for example, but not limited to, dry etching, wet etching, other suitable processes, or combinations thereof. The etching process selectively removes the mask segments 413 and the upper parts of the sacrificial segments 313' with respect to the first nanosheets 311 and the isolation structures 5. That is, for example, the etching process implements an etchant that has a high etch selectivity for, silicon nitride (i.e., the mask segments 413) and silicon germanium (i.e., the sacrificial segments 313') compared to dielectric materials (i.e., the isolation features 52 of the isolation structures 5) and semiconductor materials (i.e., the first nanosheets 311), so that the first nanosheets 311 and the isolation structures 5 are not substantially removed during removal of the mask segments 413. In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve selective removal of the mask segments 413 and the upper parts of the sacrificial segments 313'. In certain embodiments, the etching process may include multiple steps so that the mask segments 413 and the upper parts of the sacrificial segments 313' are removed separately.

Figure 9B:
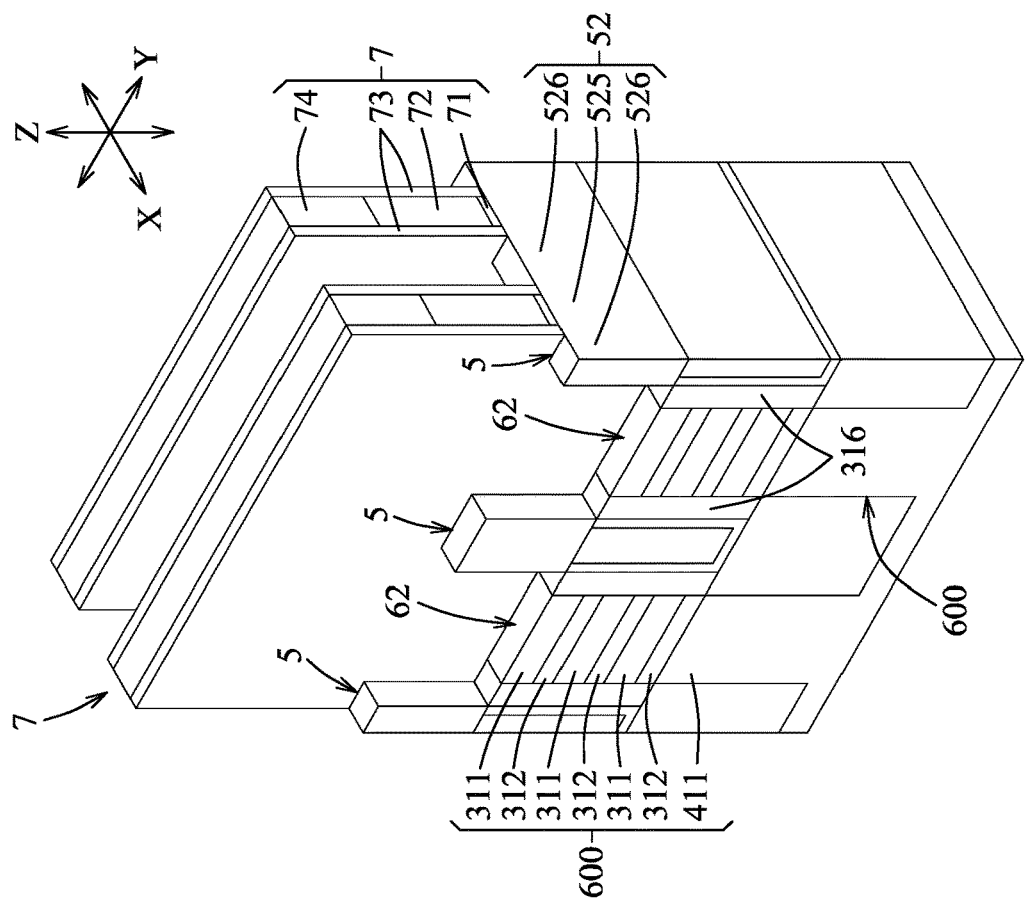
Figure 9A:
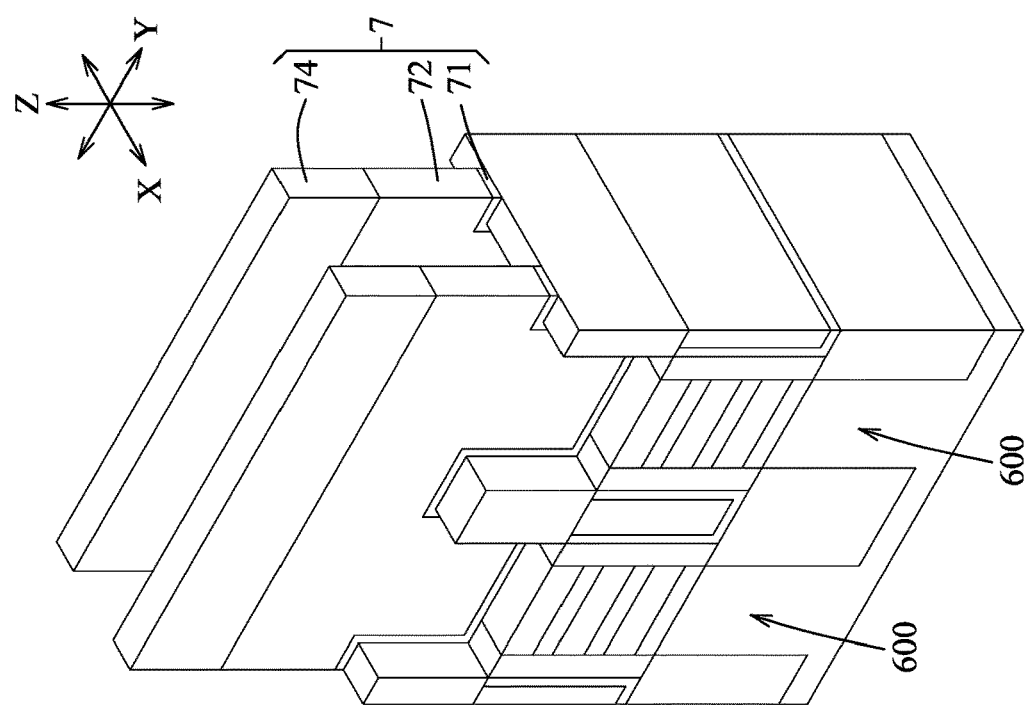

Referring to FIG. 1A and the examples illustrated in FIGS. 9A and 9B, the method proceeds to step 108, where gate structures 7, which are spaced apart in the X direction, are formed over the isolation structures 5 and the semiconductor structures 600 such that each of the semiconductor structures 600 has two exposed portions 62 (i.e., portions not covered by the gate structures 7) at two opposite sides of each of the gate structures 7. In addition, each of the isolation features 52 has an isolation element 525 disposed beneath each of the gate structures 7, and two lateral elements 526 which are respectively positioned at two opposite sides of the isolation element 525 and which are exposed from the gate structures 7. Each of the gate structures 7 includes a dummy dielectric 71 that is disposed in contact with the isolation structures 5, the sacrificial portions 316 and the semiconductor structures 600, a dummy gate 72 that is disposed on the dummy dielectric 71, and two gate spacers 73 (shown in FIG. 9B) that are disposed at two opposite sides of a dummy stack including the dummy gate 72 and the dummy dielectric 71. Each of the gate structures 7 extends in a direction different from that of each of the semiconductor structures 600. In FIGS. 9A and 9B, each of the gate structures 7 is elongated in a direction (i.e., the Y direction) transverse or orthogonal to an elongated direction of each of the semiconductor structures 600 (i.e., the X direction). In some embodiments, the dummy stack further includes a hard mask 74 disposed on the dummy gate 72.

To form the dummy stack, step 108 may include the following sub-steps: (i) conformally and sequentially forming a dummy dielectric layer, a dummy gate layer and a hard mask layer on the structure shown in FIG. 8, and (ii) patterning the hard mask layer, the dummy gate layer, and the dummy dielectric layer. The dummy dielectric layer, the dummy gate layer and the hard mask layer may be formed using a deposition process, for example, but not limited to, ALD, CVD, PVD, MOCVD, RPCVD, LPCVD PECVD, other suitable techniques, or combinations thereof. The dummy dielectric layer may include a dielectric material, such as silicon oxide, but not limited thereto. The dummy gate layer may include polycrystalline silicon, microcrystal silicon, amorphous silicon, or the like, but not limited thereto. The hard mask layer may include silicon nitride, silicon oxide, silicon oxynitride, or combinations thereof, but not limited thereto. Each of the dummy dielectric layer, the dummy gate layer, and the hard mask layer may include sub-layers. The dummy dielectric layer, the dummy gate layer, and the hard mask layer may be patterned using an etching process, such as a dry etching process, a wet etching process, or the like, or combinations thereof. Before the etching process, a lithography process may be used to develop a resist layer on the hard mask layer. Other materials and processes suitable for forming the dummy stack are within the contemplated scope of the present disclosure.

To form the two gate spacers 73, step 108 may further include the following sub-steps: (iii) forming a gate spacer layer that is disposed to cover the structure shown in FIG. 9A, and (iv) removing portions of the gate spacer layer to form the gate spacers 73 disposed to sandwich the dummy stack. The gate spacers 73 may include, for example, but not limited to, a silicon carbon-containing dielectric material, a silicon oxide-containing material, silicon nitride, other suitable materials, or combinations thereof. The gate spacer layer may be formed using a deposition process, for example, CVD, PVD, PECVD, or the like, or combinations thereof. The portions of the gate spacer layer may be removed using an etching process. The etching process may be an anisotropic etching process such as dry etching, but not limited thereto, and is performed so that remaining portions of the gate spacer layer form into the gate spacers 73 disposed on two opposite sides of the dummy stack. In some embodiments, the gate spacer layer includes sub-layers, and thus, the gate spacers 73 has a layered structure (not shown). In the gate structure 7, a cross-sectional area at an upper portion (i.e., more distal from the semiconductor structures 600) thereof perpendicular to the Z axis may be smaller than that at a lower portion (i.e., more proximal to the semiconductor structures 600) thereof. Other processes and materials suitable for forming the gate spacers 73 are within the contemplated scope of the present disclosure.

Figure 10B:
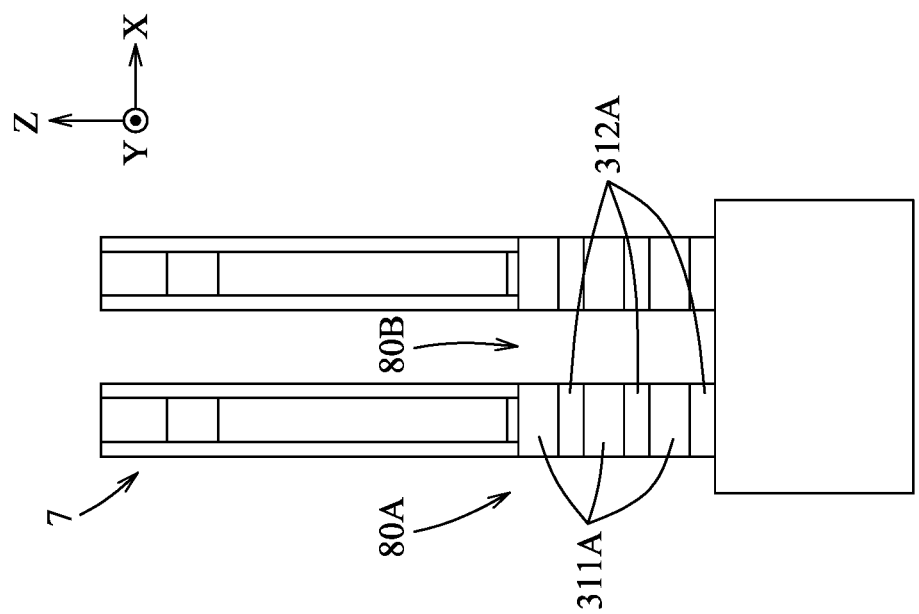
Figure 10A:
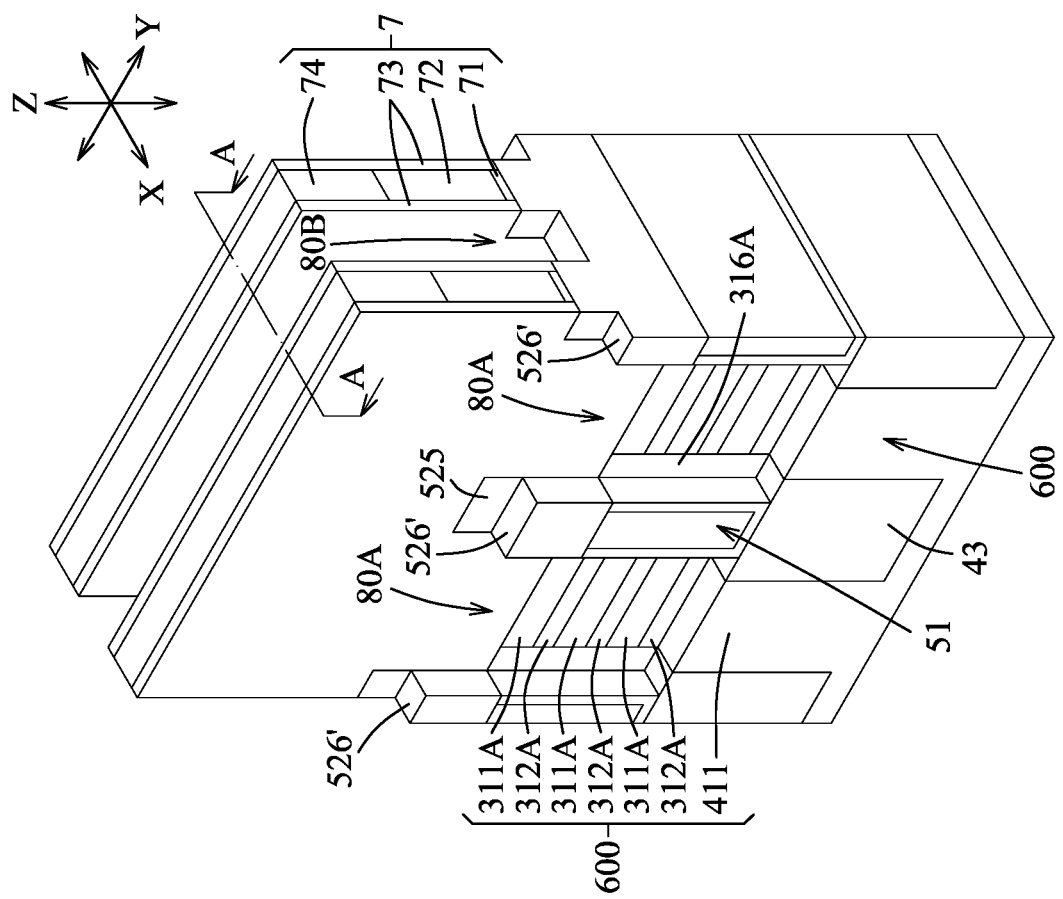

Referring to FIG. 1A and the examples illustrated in FIGS. 9B and 10A, the method proceeds to step 109, where first and second source/drain recesses 80A, 80B are formed respectively in the exposed portions 62 of each of the semiconductor structures 600. FIG. 10B is a cross-sectional view taken along line A-A of FIG. 10A, in which the isolation structures 5 are not drawn for the sake of simplicity. Step 109 may include the following sub-steps: (i) removing the exposed portions 62 of the semiconductor structures 600 so that the first nanosheets 311 are formed into first nanosheet segments 311A, and the second nanosheets 312 are formed into second nanosheet segments 312A, and (ii) removing lateral parts of the sacrificial portions 316 not covered by the gate structures 7 so as to leave sacrificial bodies 316A and to expose the trench isolation elements 43. The first and second source/drain recesses 80A, 80B are each defined by side surfaces of two adjacent ones of the isolation bodies 51, side surfaces of the sacrificial bodies 316A disposed under a corresponding one of the gate structures 7, and side surfaces of the first and second nanosheet segments 311A, 312A of a corresponding one of the semiconductor structures 600. That is, after completing step 109, a first end region of each of the first and second nanosheet segments 311A, 312A and the sacrificial bodies 316A is exposed from the first source/drain recess 80A, and a second end region of each of the first and second nanosheet segments 311A, 312A and the sacrificial bodies 316A is exposed from the second source/drain recess 80B.

The first and second source/drain recesses 80A, 80B may be formed using a dry etching process, a wet etching process, other suitable etching processes, or combinations thereof. In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve formation of the first and second source/drain recess 80A, 80B. Other processes suitable for forming the first and second source/drain recesses 80A, 80B are within the contemplated scope of the present disclosure. In some embodiments, upper parts of the lateral elements 526 may be removed during formation of the first and second source/drain recess 80A, 80B, while remaining parts of the lateral elements 526 are denoted by the numeral 526' (see FIGS. 9B and 10A).

Figure 11B:
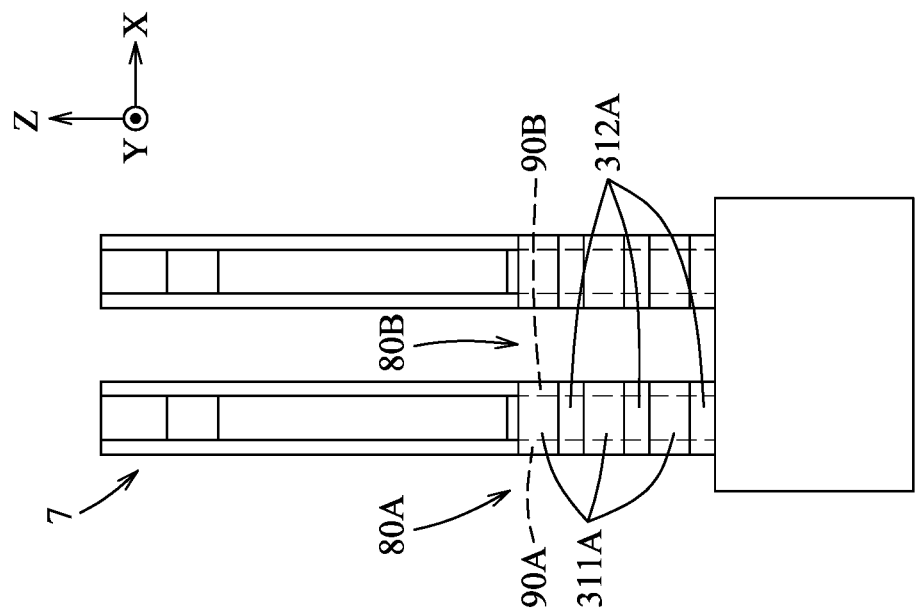
Figure 11A:
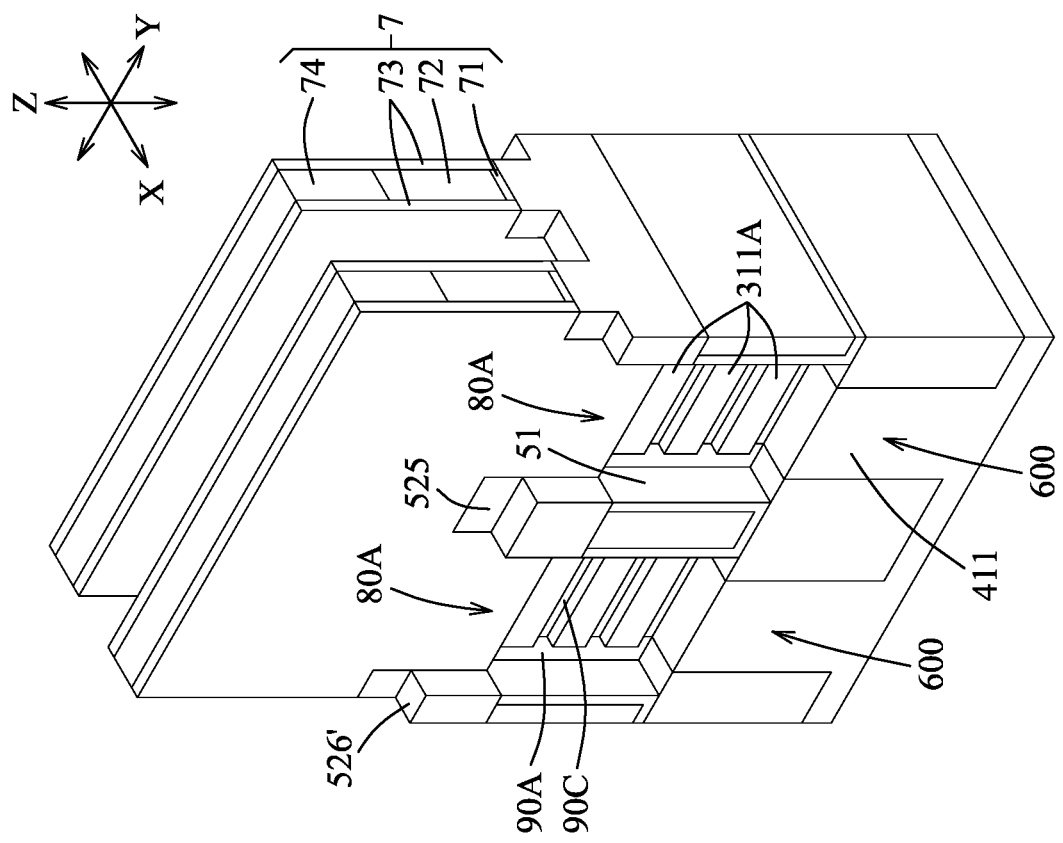
Figure 11C:
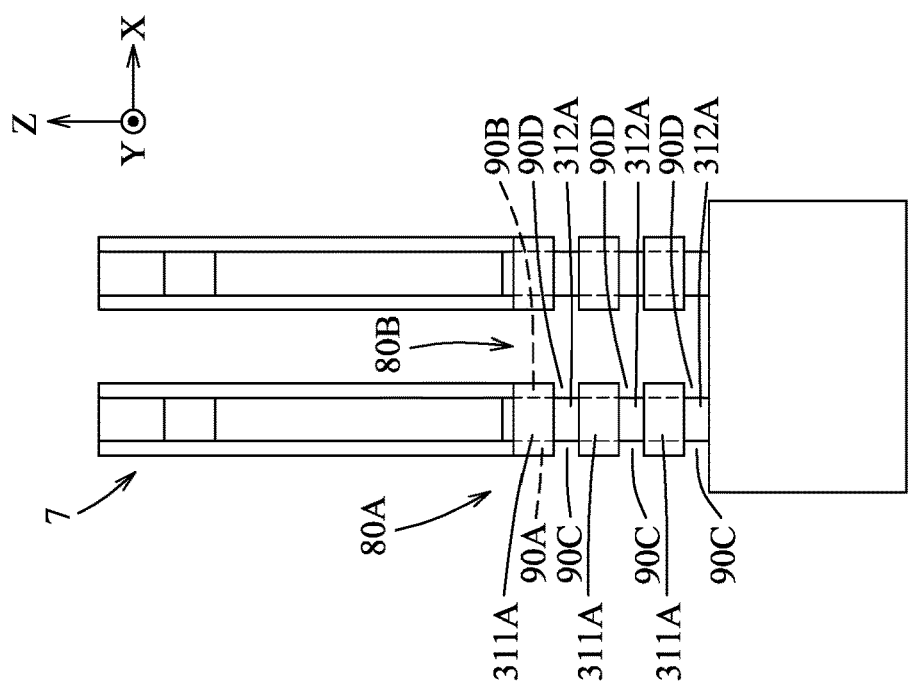

Referring to FIG. 1A and the examples illustrated in FIGS. 10A and 11A, the method proceeds to step 110, where first and second inner gaps 90A, 90B and first and second lateral recesses 90C, 90D are formed by respectively removing portions of the sacrificial bodies 316A and portions of the second nanosheet segments 312A. Step 110 may include the following sub-steps: (i) removing the first and second end regions of the sacrificial bodies 316A to form first and second inner gaps 90A, 90B, respectively, and (ii) removing the first and second end regions of the second nanosheet segments 312A to form first lateral recesses 90C and second lateral recesses 90D, respectively. FIGS. 11B and 11C are cross-sectional views similar to FIG. 10B but respectively showing the structure after the aforementioned sub-steps (i) and (ii) in step 110 in accordance with some embodiments.

Referring to FIGS. 11A and 11C, the first inner gaps 90A and the first lateral recesses 90C are formed under the gate spacers 73 of the gate structures 7, and are each in a corresponding one of the first source/drain recesses 80A. The second inner gaps 90B and the second lateral recess 90D are formed under the gate spacers 73 of the gate structures 7, and are each in a corresponding one of the second source/drain recesses 80B. In some embodiments, each of the first and second inner gaps 90A, 90B and each of the first and second lateral recesses 90C, 90D can extend to locate partially under the dummy dielectric 71 of a corresponding one of the gate structures 7. The first nanosheet segments 311A under the gate spacers 73 of the corresponding gate structure 7 are each separated from adjacent ones of the isolation bodies 51 by a corresponding one of the first/second inner gaps 90A/90B. The first nanosheet segments 311A in each of the semiconductor structures 600 are separated from one another by the corresponding first and second lateral recesses 90C, 90D. A lowermost one of the first nanosheet segments 311A is separated from the substrate segment 411 by a lowermost one of the first and second lateral recesses 90C, 90D.

Step 110 may be performed using an etching process such as wet etching, or the like, but not limited thereto. The first and second inner gaps 90A, 90B and the first and second lateral recesses 90C, 90D may be formed by multiple and/or different etching processes, and may not be spontaneously formed. In some embodiments, the etching process implements an etchant having an etch selectivity for silicon germanium (i.e., the sacrificial portions 316 and the second nanosheets 312) with respect to silicon (i.e., the first nanosheets 311). In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve removal of the end regions of the sacrificial bodies 316A and the end regions of the second nanosheet segments 312A. Other suitable processes for forming the first and second inner gaps 90A, 90B and the first and second lateral recesses 90C, 90D are within the contemplated scope of the present disclosure.

Figure 12A:
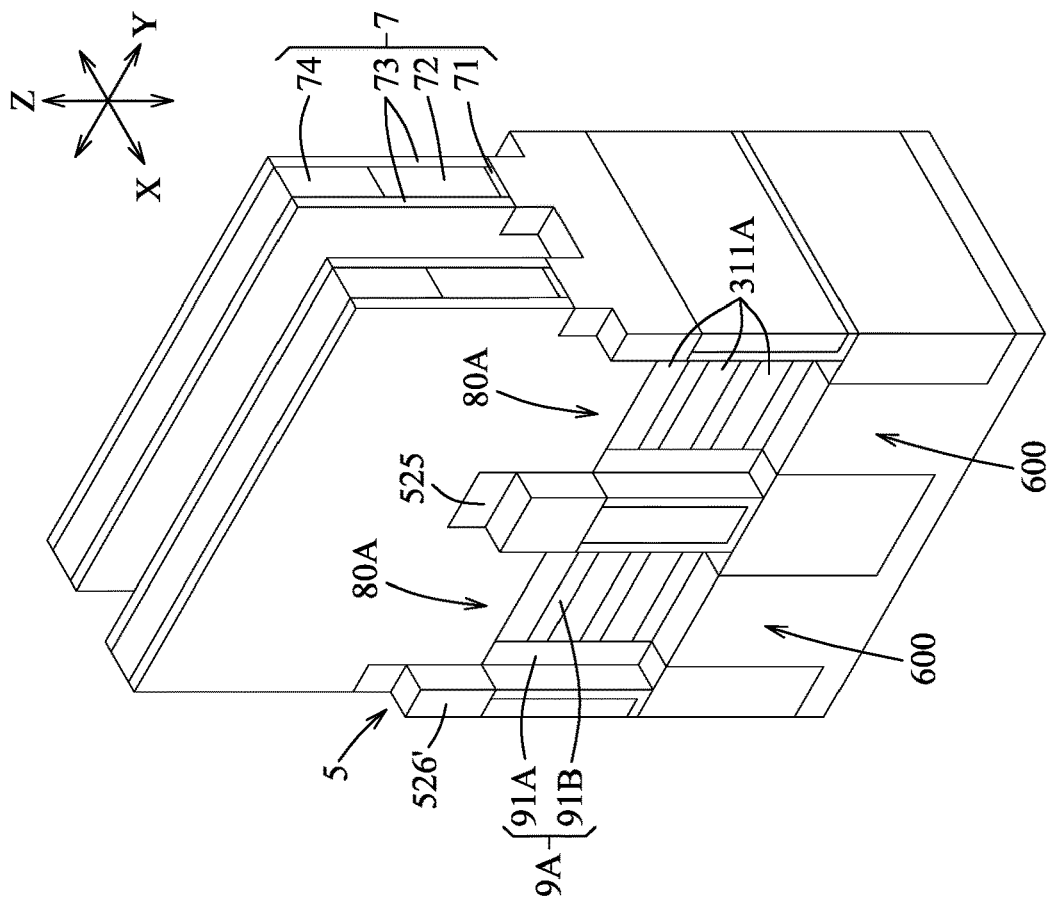
Figure 12C:
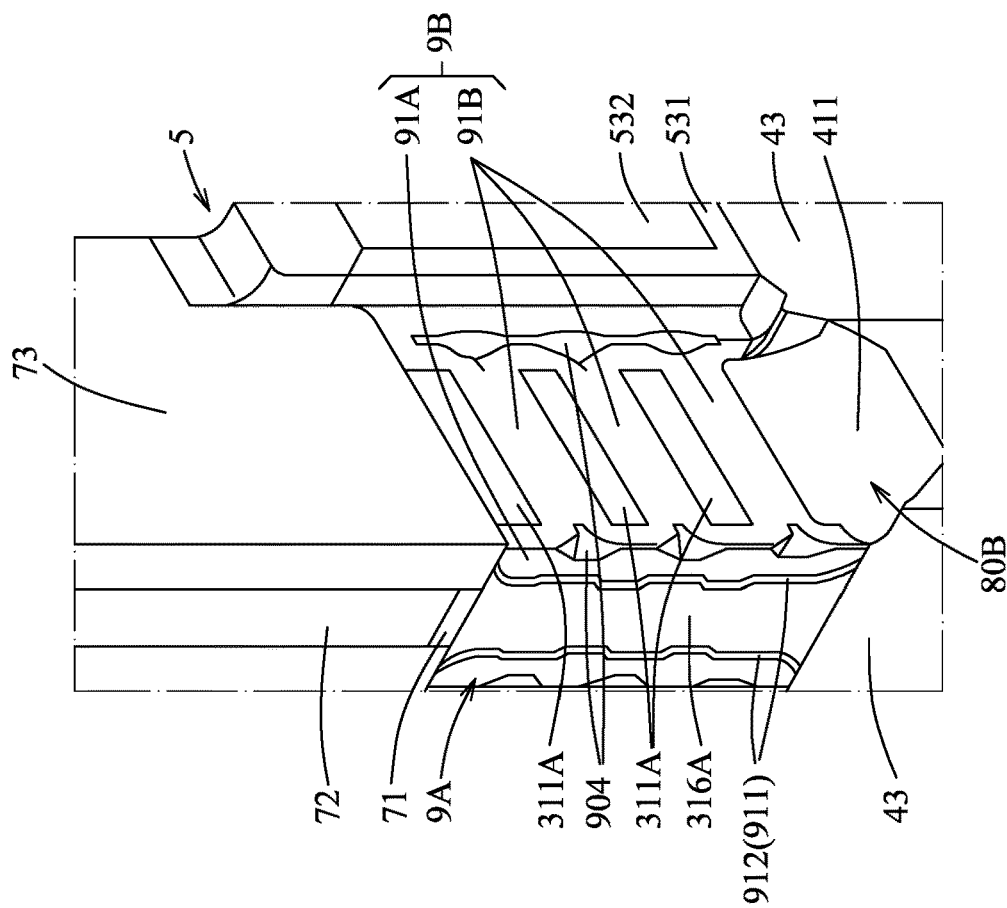
Figure 12B:
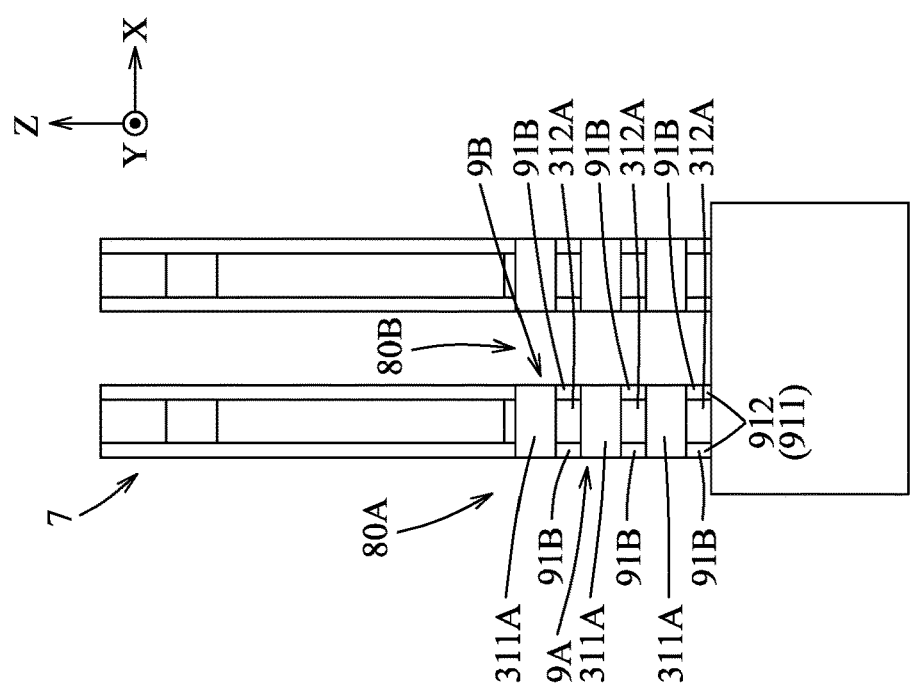

Referring to FIG. 1B and the examples illustrated in FIGS. 11A, 11C and 12A, the method proceeds to step 111, where a first inner spacer portion 9A is formed to fill the first inner gap 90A and the first lateral recess 90C; and where a second inner spacer portion 9B (see FIGS. 12B and 12C) is formed to fill the second inner gap 90B and the second lateral recess 90D. FIG. 12B is a cross-sectional view similar to FIG. 11C but showing the structure after step 111 in accordance with some embodiments. FIG. 12C is a schematic enlarged perspective view illustrating the second inner spacer portion 9B in the second source/drain recess 80B in accordance with some embodiments.

In some embodiments, each of the first and second inner spacer portions 9A, 9B includes a plurality of vertical regions 91A and a plurality of horizontal regions 91B. Each of the horizontal regions 91B is disposed between the first end regions or the second end regions of two adjacent ones of the nanosheet segments 311A, and each of the vertical regions 91A is disposed to interconnect the horizontal regions 91B with a corresponding one of the isolation structures 5.

In some embodiments, during formation of the first and second inner spacer portions 9A, 9B, a first treatment (zip-up treatment) is performed to permit each of the first and second inner spacer portions 9A, 9B to have a carbon-rich region 911 which confronts the sacrificial bodies 316A and the second nanosheet segments 312A of a corresponding one of the semiconductor structures 600, and a remaining region which is opposite to the carbon-rich region 911 and which confronts to a corresponding one of the first and second source/drain recesses 80A, 80B. In some embodiments, the carbon-rich region 911 has a carbon atomic concentration higher than that of the remaining region by, for instance, not less than 0% and not greater than about 25%, so as to maintain electric leakage level of the device produced therefrom. In some other embodiments, the carbon atomic concentration of the carbon-rich region 911 is higher than that of the remaining region by not less than 0% and not greater than about 20%. In yet other embodiments, the carbon atomic concentration of the carbon-rich region 911 is higher than that of the remaining region by not less than 0% and not greater than about 10%. In some embodiments, the carbon-rich region 911 has a dielectric constant lower than that of the remaining region by not less than 0 and not greater than about 0.8. In some embodiments, the carbon-rich region 911 has a thickness ranging from about 0.5 nm to about 8 nm.

In some embodiments, step 111, when the first treatment is performed, may include the following sub-steps: (i) forming a spacer layer 900 (see FIG. 12D) over the structure shown in FIGS. 11A and 11C, (ii) subjecting the spacer layer 900 to the first treatment, (iii) subjecting the treated spacer layer 900 to an annealing process, and (iv) removing excess portions of the resultant spacer layer 900 to leave the vertical regions 91A in the first and second inner gaps 90A, 90B, and to leave the horizontal regions 91B in the first and second lateral recesses 90C, 90D.

The spacer layer 900, which forms the first and second inner spacer portions 9A, 9B, may include a dielectric material which includes at least one of silicon (e.g., silicon oxide), carbon (e.g., silicon carbide), oxygen (e.g., silicon oxynitride), nitrogen (e.g., silicon nitride), fluorine, boron, or combinations thereof. In some embodiments, the dielectric material is a silicon-based dielectric material. The silicon-based dielectric material may include oxygen and/or nitrogen, for instance, $SiOCH_x$, $SiCOH_x$, $SiONCH_x$, $SiOCNH_x$, $SiNCH_x$, $SiCNH_x$, $SiNCOH_x$, etc., where x is an integer larger than 0. In some embodiments, carbon atomic concentration of the spacer layer 900 is not less than 0% and not greater than about 25%, and nitrogen atomic concentration of the spacer layer 900 is not less than 0% and not greater than about 30%, which is conducive to maintain electric leakage level of the device produced therefrom. The spacer layer 900 may have a density ranging from about 1.5 g/cm$^3$ to about 2.8 g/cm$^3$, and a dielectric constant ranging from about 1 to about 5, such that the first and second inner spacer portions 9A, 9B formed therefrom may have a low capacitance, which is conducive to achieve improved frequency of the device. The spacer layer 900 may be intrinsic or doped with a dopant, such as an n-type dopant or a p-type dopant. Other suitable materials for the spacer layer 900 are within the contemplated scope of the present disclosure. The spacer layer 900 may be formed by a deposition process, for example, but not limited to, ALD, PVD, CVD, PECVD, plating, other suitable processes, or combinations thereof.

Figure 12E:
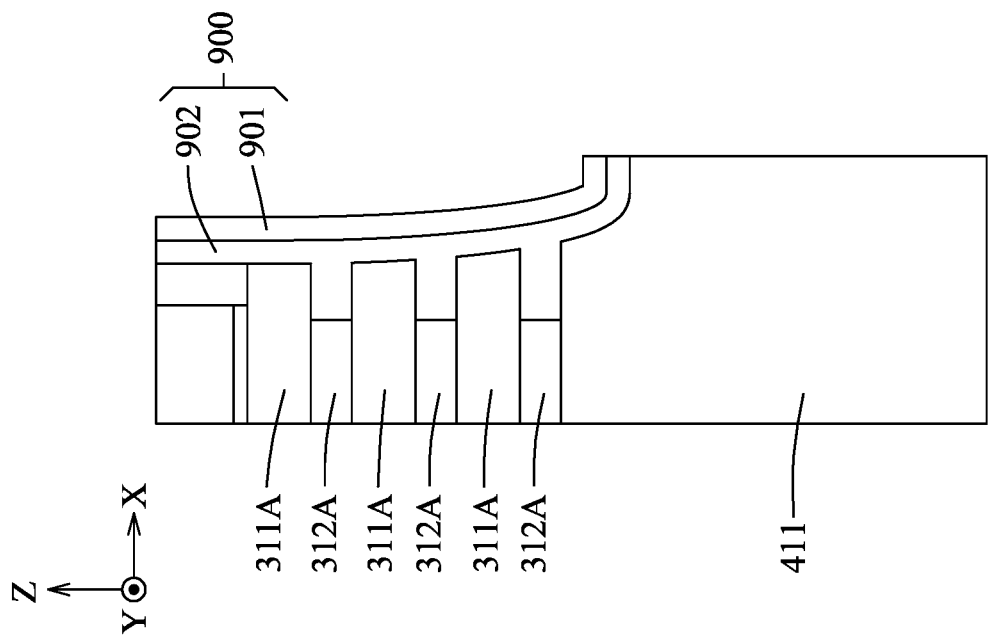
Figure 12D:
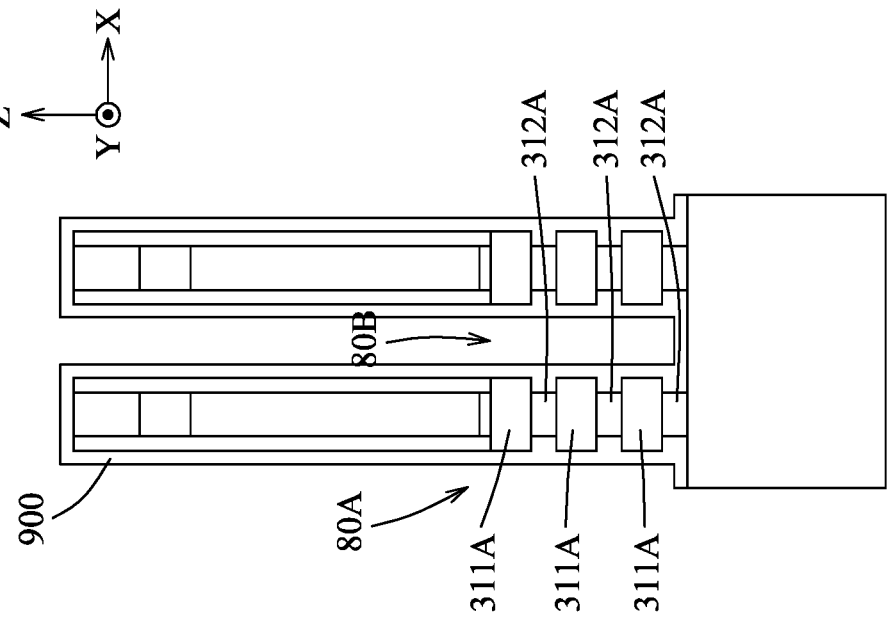

FIG. 12E is a schematic enlarged view illustrating the spacer layer 900 along the X direction after completing sub-step (ii) of step 111 in accordance with some embodiments. FIG. 12F is a schematic view illustrating the spacer layer 900 along the Y direction after completing sub-step (ii) of step 111 in accordance with some embodiments, in which only the isolation structures 5, the spacer layer 900, the trench isolation elements 43 and the substrate segment 411 are drawn. Referring to FIGS. 12E and 12F, in sub-step (ii) of step 111, the first treatment is performed so that the carbon atoms at an outer surface portion 901 of the spacer layer 900 may diffuse in a direction away from the outer surface portion 901 into an inner surface portion 902 of the spacer layer 900 around, for example, the sacrificial bodies 316A and the second nanosheet segments 312A. That is, carbon atoms are concentrated in the inner surface portion 902, leaving the outer surface portion 901 of the spacer layer 900 as carbon-depleted, which is effective to concentrate carbon atoms in the first and second inner spacer portions 9A, 9B formed subsequently, so that the first and second inner spacer portions 9A, 9B have an improved strength that can be retained in subsequent steps.

The first treatment may be one of a radical treating process, a plasma treating process, or a microwave treating process, or combinations thereof. Other suitable processes for treating the spacer layer 900 are within the contemplated scope of the present disclosure. The first treatment may be performed in one single step of treating process, or performed in several steps with same treating process, or different treating processes. The first treatment may be performed using a treating source of, for instance, an oxygen-based source, a nitrogen-based source, or a hydrogen-based source, or combinations thereof. Examples of the oxygen-based source may include, but are not limited to, $O_2$ plasma, $O_2$ radical, $O_3$, $H_2O$, or combinations thereof. Examples of the nitrogen-based source may include, but are not limited to, $NH_3$ soaking, $NH_3$ radical, $N_2O$ plasma, $N_2$ plasma, $N_2$ radical, or combinations thereof. Examples of the hydrogen-based source may include, but are not limited to, $H_2$ plasma, $H_2$ radical, or a combination thereof. In addition, the abovementioned treating source(s) may also include any other suitable materials to enhance performance of the first treatment, for instance, $CH_4$, $SiH_4$, Ar, Xe, $H_2$, $N_2$, He, or $O_2$. Other suitable materials for the treating source of the first treatment are within the contemplated scope of the present disclosure. In some embodiments, a DC Bias voltage ranging from about 200 eV to about 10 kV may be applied for the first treatment. The first treatment may be performed using, for example, a single wafer processing apparatus, a furnace type apparatus, a rotary apparatus, but are not limited thereto. In some embodiments, a treat depth in the first treatment may range from about 0.5 nm to about 8 nm. Other suitable apparatus for performing the first treatment are within the contemplated scope of the present disclosure. The first treatment may be performed with parameters adjusted according to practical needs, for instance, DC bias applied, treatment source, type of wafer, distance between the treatment source and the structure, pressure, temperature, usage of ion filter, etc. In some embodiments, the first treatment may be a self-limit nitrogen radical treatment.

Figure 12G:
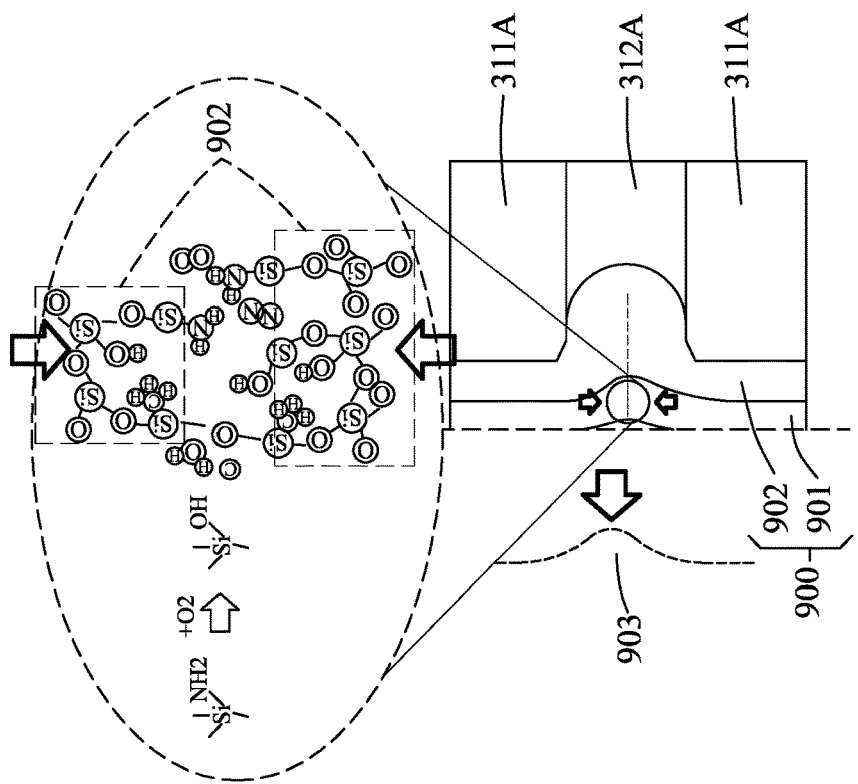
Figure 12F:
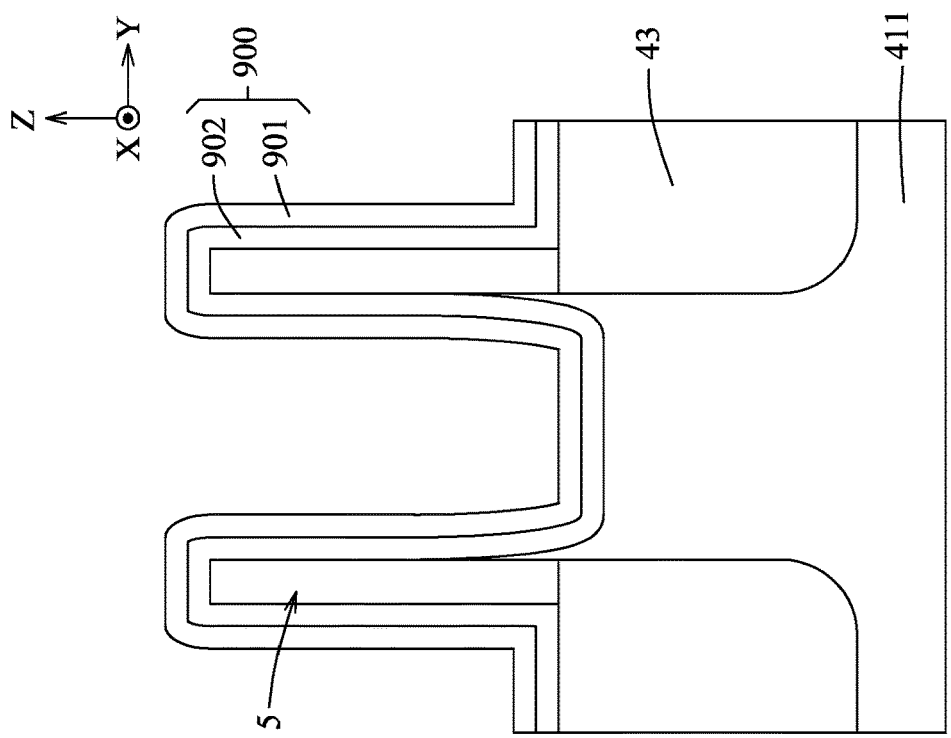

In sub-step (iii), as shown in FIG. 12G, the treated spacer layer 900 is subjected to an annealing process, for instance, a chemical soaking annealing process (annealing using chemical vapor), an UV cure annealing process, a wet annealing process, a dry annealing process, or combinations thereof. Other suitable annealing processes are within the contemplated scope of the present disclosure. The annealing process may be performed using, for example, a single wafer processing apparatus, a furnace type apparatus, a rotary apparatus, but are not limited thereto. Other suitable apparatus for the annealing process are within the contemplated scope of the present disclosure. In some embodiments, the annealing process is performed in the presence of $O_2$ at a temperature ranging from about 300° C. to about 700° C., followed by the presence of nitrogen at a temperature ranging from about 300° C. to about 700° C. Other suitable annealing processes or annealing conditions are within the contemplated scope of the present disclosure. By performing the annealing process, Si—N bonding at the outer surface portion 901 may undergo oxidation so as to form Si—OH bonding at the outer surface portion 901, which serves as a hydrophilic surface. After sub-step (iii), size of depression 903 at each of junctions of each of the first and second lateral recesses 90C, 90D and a corresponding one of the first or second inner gaps 90A, 90B (see FIG. 11C) is reduced, i.e., a shallower depression (see FIG. 12G).

In sub-step (iv), removal of the excess portions of the spacer layer 900 may be performed using an etching process, for example, but not limited to, a wet etching process, or other suitable techniques. Portions of the spacer layer 900 are removed to expose the ends of the first nanosheet segments 311A. Remaining portions of the spacer layer 900 partially or completely fill the first and second inner gaps 90A, 90B and the first and second lateral recesses 90C, 90D so as to form into the vertical regions 91A and the horizontal regions 91B, thereby obtaining the first inner spacer portion 9A and the second inner spacer portion 9B. Other processes suitable for forming the first and second inner spacer portions 9A, 9B are within the contemplated scope of the present disclosure.

Since the outer surface portion 901 of the spacer layer 900 is carbon-depleted and the inner surface portion 902 is carbon-rich, the structural strength of the inner surface portion 902 is higher than that of the outer surface portion 901, and some regions of the inner surface portion 902, which are located respectively inside the first and second inner gaps 90A, 90B and the first and second lateral recesses 90C, 90D, are less likely to be removed. Therefore, after removal of the excess portions of the spacer layer 900, the size of depression 904 at each of junctions of each of the vertical regions 91A and a corresponding one of the horizontal regions 91B is reduced, i.e., a shallower depression (see FIG. 12C).

In some embodiments, each of the first and second inner spacers 9A, 9B have the carbon-rich region 911 which is located away from a respective one of the first and second source/drain recesses 80A, 80B, and the remaining region (carbon-depleted region) which is located in the respective one of the first and second source/drain recesses 80A, 80B, while in some other embodiments, during removal of the excess portion of the spacer layer 900, the outer surface portion (carbon-depleted) 901 is fully removed, and each of the first and second inner spacers 9A, 9B is formed from a part of the inner surface portion (carbon-rich) 902. In the carbon-rich region 911, carbon atoms may be bonded to silicon atoms to form carbon-silicon bonding which may be presented in the form of Si—C—O, Si—C—N, Si—CH$_3$, Si—CO$_2$, or other suitable forms.

Figure 13B:
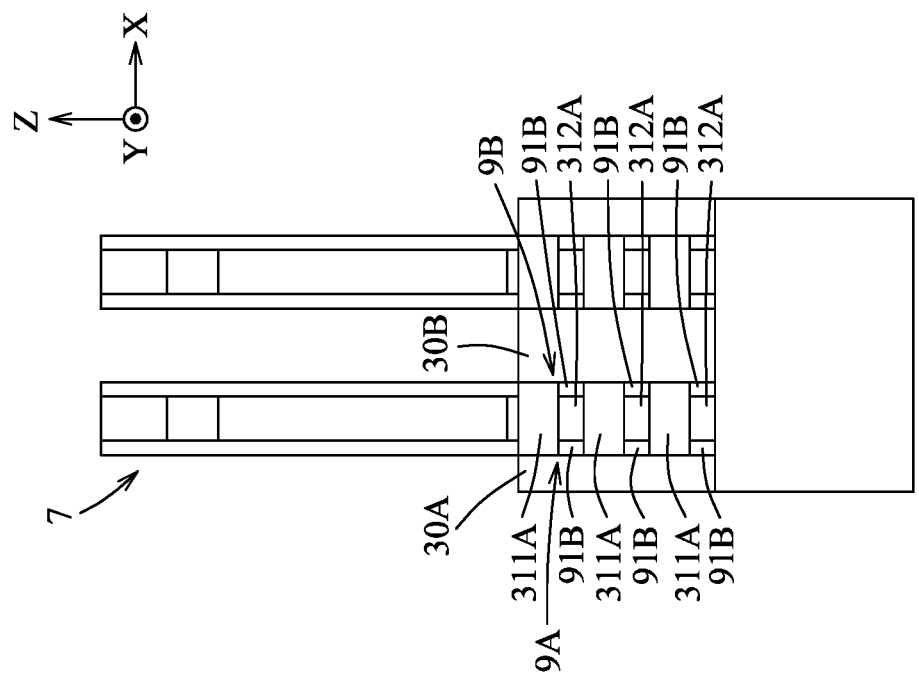
Figure 13A:
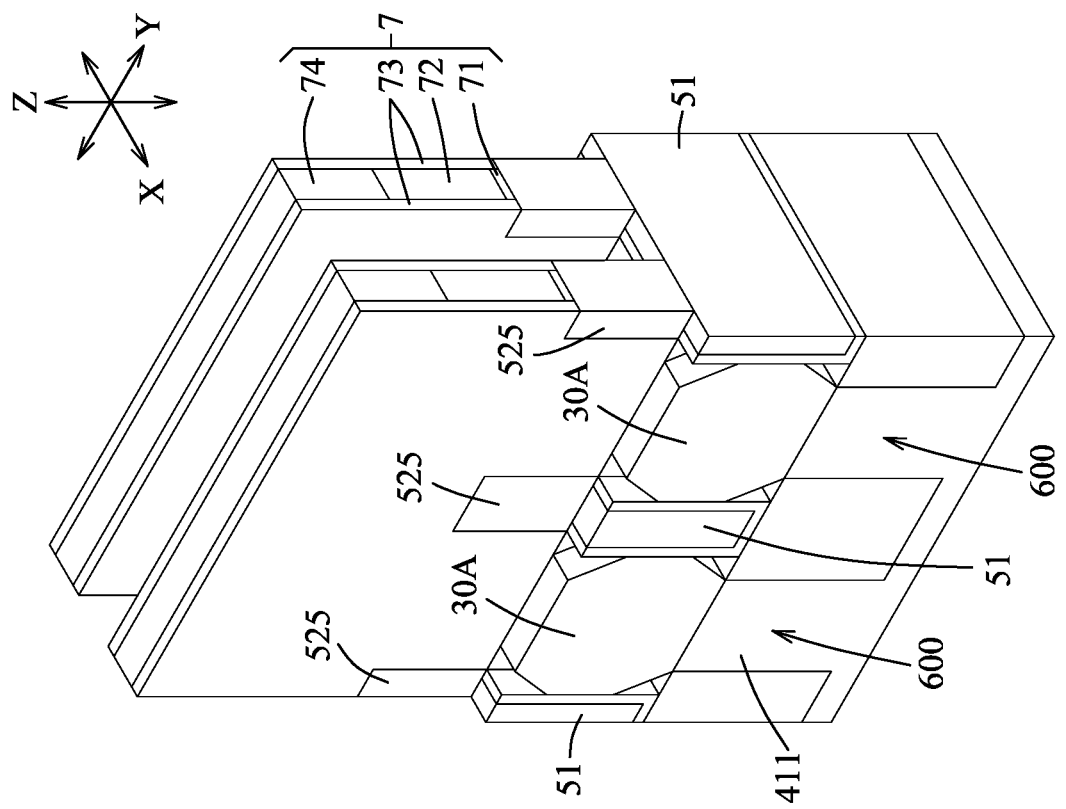
FIG. 13C is a broken line graph showing relative carbon atomic concentration at different intermediate stages with and without performing a first treatment in accordance with some embodiments of the present disclosure.

Referring to FIG. 1B and the examples illustrated in FIGS. 12A, 12B, 13A and 13B, the method proceeds to step 112, where, in each of the semiconductor structures 600, a first source/drain portion 30A is formed in the first source/drain recess 80A, and a second source/drain portion 30B is formed in the second source/drain recess 80B. Each of the first source/drain portions 30A and a corresponding one of the second source/drain portions 30B are interconnected by a corresponding one of the first nanosheet segments 311A. FIG. 13B is a cross-sectional view similar to that of FIG. 12B but illustrating the structure after step 112 in accordance with some embodiments.

In some embodiments, the first and second source/drain portions 30A, 30B are formed to completely fill the first and second source/drain recesses 80A, 80B. In some other embodiments, the first and second source/drain portions 30A, 30B do not completely fill the first and second source/drain recesses 80A, 80B, and the first and second source/drain portions 30A, 30B may be spaced apart from the trench isolation elements 43 and/or the isolation structures 5. In certain embodiments, upper surfaces of each of the first and second source/drain portions 30A, 30B are at substantially the same level as an upper surface of the uppermost one of the first nanosheet segments 311A. In alternate embodiments, the upper surfaces of each of the first and second source/drain portions 30A, 30B are at a level slightly higher than the upper surface of the uppermost one of the first nanosheet segments 311A with respect to an upper surface of the substrate segment 411 of the each of the semiconductor structures 600. The first and second source/drain portions 30A, 30B may be formed using an epitaxy growth process, which may involve a deposition process such as CVD, but not limited thereto. The epitaxy growth process may implement a precursor which reacts with the material(s) in the substrate segment 411 and/or the first nanosheet segments 311A. In some embodiments, the first and second source/drain portions 30A, 30B of the semiconductor structures 600 are not spontaneously formed. For example, a mask may be used during the epitaxy growth process to mask at least one of the semiconductor structure 600 (not yet formed with the first and second source/drain portions 30A, 30B) so that the first and second source/drain portions 30A, 30B of remaining one(s) of the semiconductor structure 600 are formed before those of the masked one(s) of the semiconductor structure 600. Other processes suitable for forming the first and second source/drain portions 30A, 30B are within the contemplated scope of the present disclosure.

In some embodiments, each of the first and second source/drain portions 30A, 30B may be formed by, for example, but not limited to, sequentially forming a first epitaxial layer (L0), a second epitaxial layer (L1), and a third epitaxial layer (L2) (see FIGS. 21C and 21D) in a corresponding one of the first and second source/drain portions 30A, 30B, and each of the epitaxial layers (L0, L1, L2) may be a semiconductor epitaxial layer doped with a dopant, such as an n-type dopant, a p-type dopant, or a combination thereof. The semiconductor epitaxial layer may include silicon, silicon germanium, silicon carbide, germanium, III-V compound semiconductors, or combinations thereof. In certain embodiments, for an n-type transistor, each of the first and second source/drain portions 30A, 30B includes silicon and an n-type dopant(s), such as arsenic, phosphorous, carbon, or the like, or combinations thereof. In some embodiments, for a p-type transistor, each of the first and second source/drain portions 30A, 30B includes germanium or silicon germanium and a p-type dopant, such as boron, aluminum, or the like, or combinations thereof. Other materials suitable for the first and second source/drain portions 30A, 30B are within the contemplated scope of the present disclosure. The dopants in the first and second source/drain portions 30A, 30B may be activated using an annealing process, but not limited thereto. The first and second source/drain portions 30A, 30B may be in-situ doped or doped using an ion implantation process, but not limited thereto. Other processes suitable for doping the source/drain portions 30 are within the contemplated scope of the present disclosure.

Figure 13C:
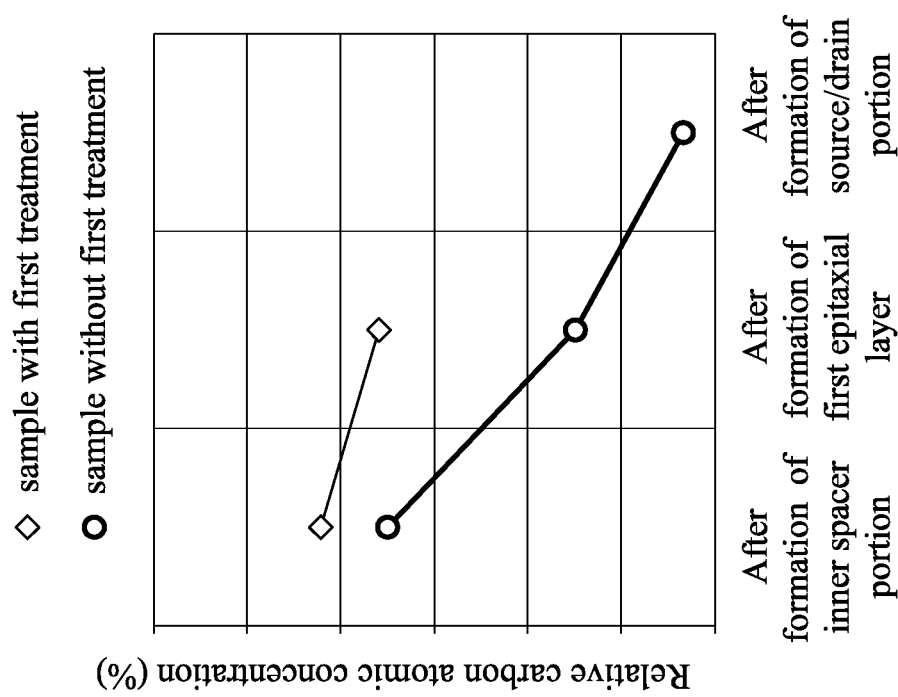

FIG. 13C is a broken line graph showing relative carbon atomic concentration at different intermediate stages with and without performing the first treatment in accordance with some embodiments of the present disclosure.

For a sample in which the first and second inner spacer portions 9A, 9B are formed with the first treatment, an analysis of relative atomic concentration of carbon was performed on a region of each of the first and second inner spacer portions 9A, 9B confronting the sacrificial bodies 316A and the second nanosheet segments 312A after formation of the first and second inner spacer portions 9A, 9B (step 111), and after formation of the first epitaxial layer (L0) in step 112. In addition, for another sample in which the first and second inner spacer portions 9A, 9B are formed without the first treatment, a region of each of the first and second inner spacer portions 9A, 9B confronting the sacrificial bodies 316A and the second nanosheet segments 312A is also subjected to the same analysis, and the relative carbon atomic concentration after formation of the first and second source/drain portions 30A, 30B is also determined. In FIG. 13C, a relative carbon atomic concentration of the first and second inner spacer portions 9A, 9B subjected to the first treatment is represented by a legend "with first treatment," and a relative carbon atomic concentration of the first and second inner spacer portions 9A, 9B not subjected to the first treatment is represented by another legend "without first treatment." The results in FIG. 13C show that the sample with first treatment has a higher relative carbon atomic concentration after formation of the first and second inner spacer portions 9A, 9B, as well as after formation of the first epitaxial layer than the another sample without first treatment. In addition, the sample with first treatment shows a relatively lower reduction in relative atomic concentration of carbon than the another sample without first treatment. These results indicate that the first treatment effectively enriches carbon content of the first and second inner spacer portions 9A, 9B, and is conducive to enhance strength thereof, so as to avoid damage during subsequent steps of manufacture of the device.

In some other embodiments, after step 112, the remaining parts 526' are removed (i.e., recessed in the Z direction, see FIGS. 12A and 13A), using, for example, an etching process, such as wet etching, dry etching, or the like, or combinations thereof. In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve selective removal of the remaining parts 526'. Other suitable processes for removing the remaining parts 526' are within the contemplated scope of the present disclosure. By removal of the remaining parts 526', a capacitance impact of the device 200 (shown in FIG. 21A) can be reduced. In some other embodiments, the remaining parts 526' are removed at any steps after step 109 and before step 113.

Referring to FIG. 1B and the examples illustrated in FIGS. 13A, 13B, 14A and 14B, the method proceeds to step 113, where interlayer dielectric (ILD) layers 93 are each disposed to cover corresponding ones of the first or second source/drain portions 30A, 30B and portions of the isolation structures 5 aside the corresponding first and second source/drain portions 30A, 30B so as to alternate with the gate structures 7. In some embodiments, a plurality of contact etch-stop layers (CESLs) 94 are each formed to separate one of the ILD layers 93 from the corresponding first or second source/drain portions 30A, 30B, the corresponding remaining portions of the isolation structures 5 (each including the isolation body 51 and the isolation element 525), and two adjacent ones of the gate structures 7.

In some embodiments, step 113 may include the following sub-steps: (i) conformally forming a CESL material layer for forming the CESLs 94 over the structure shown in FIG. 13A, (ii) forming an ILD material layer for forming the ILD layers 93 over the CESL material layer so that a space between each two adjacent ones of the gate structures 7 is filled by the CESL and ILD material layers, and (iii) performing a planarization process to remove excess portions of the CESL and ILD material layers to expose the dummy gates 72 of the gate structures 7, thereby obtaining the ILD layers 93 and the CESLs 94. The ILD material layer may be formed by a deposition process. The deposition process may be, for example, but not limited to, ALD, PVD, CVD, HARP, HDP, or the like, or combinations thereof. The CESL material layer may be formed by a deposition process such as, for example, but not limited to, ALD, PVD, CVD, or the like, or combinations thereof. The planarization process may be performed using, for example, CMP, but not limited thereto. During the planarization process, portions of the gate structures 7 (i.e., portions of the gate spacers 73 and the hard masks 74 of the gate structures 7) are removed along with removal of the excess portions of the CESL and ILD material layers. In some other embodiments, the planarization process may be performed to expose the hard masks 74 of the gate structures 7. Other processes suitable for performing step 113 are within the contemplated scope of the present disclosure. After step 113, the remaining gate spacers are denoted by numeral 73'.

The ILD material layer includes a dielectric material such as, for example, but not limited to, silicon oxide, silicon nitride, SiON, phosphosilicate glass (PSG), borophosphosilicate glass (BPSG), spin-on glass (SOG), fluorosilicate glass (FSG), carbon-doped silicon oxide (e.g., SiCOH), xerogel, aerogel, parylene, divinylsiloxane-bis-benzocyclobutene-based (BCB-based) dielectric material, polyimide, or the like, or combinations thereof. The ILD material layer may be a low-k dielectric material (i.e., dielectric material having a dielectric constant less than a dielectric constant of silicon oxide). The ILD material layer may be an extreme low-k dielectric material (i.e., dielectric material having a dielectric constant less than about 2.5). The CESL material layer includes a material different from the dielectric material of the ILD material layer. The CESL material layer may include a dielectric material such as, for example, but not limited to, silicon oxide, silicon nitride, or the like, or combinations thereof. The CESL material layer may include a dielectric material that has a dielectric constant less than a dielectric constant of the dielectric material of the ILD material layer. Other materials suitable for the ILD and CESL material layers are within the contemplated scope of the present disclosure.

Figure 14A:
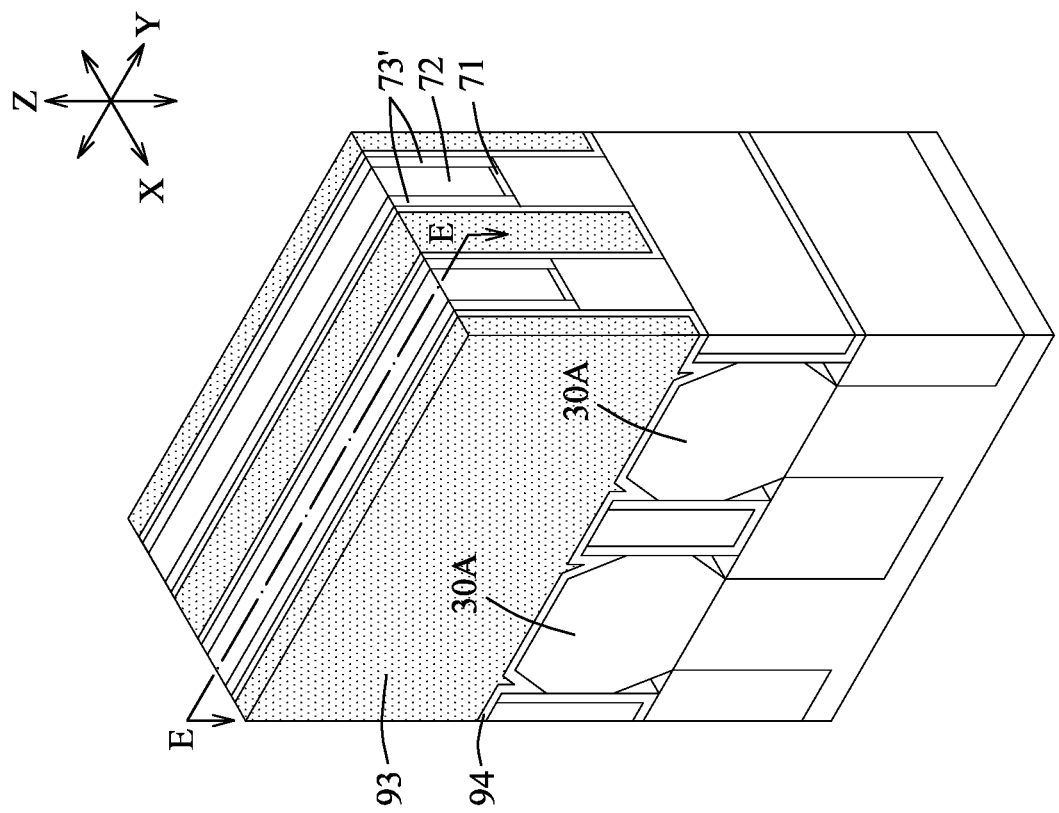
Figure 14B:
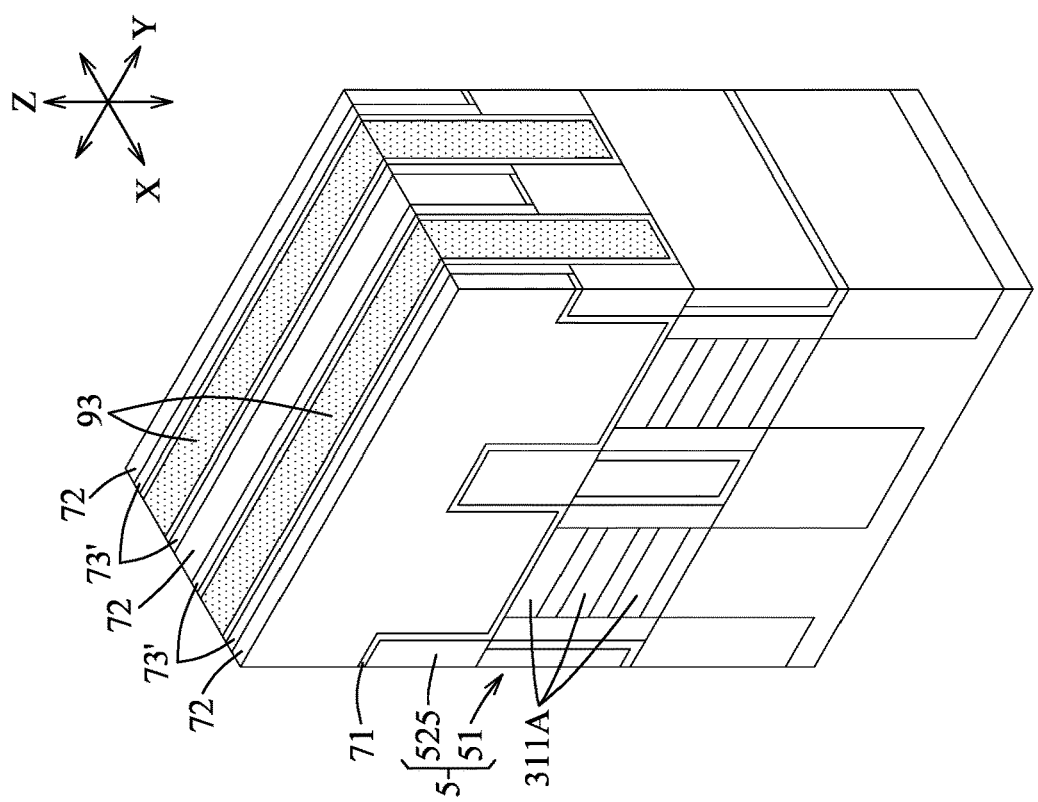

FIG. 14B is a fragmentary perspective cross-sectional view taken along line E-E of FIG. 14A. In some embodiments, after step 113, upper regions of the ILD layers 93 are etched back to form recesses (not shown) using, for example, but not limited to, a selective etching process, and then masking layers 95 (see FIG. 15) are refilled in the recesses. The refilling of the masking layers 95 may be performed by forming a masking material layer over the CESLs 94 and the remaining regions of the ILD layers 93 to fill the recesses, followed by a planarization process to expose the CESLs 94. The material and process for forming the masking layers 95 are similar to those for the CESLs 94, and the details thereof are omitted for the sake of brevity.

Figure 15:
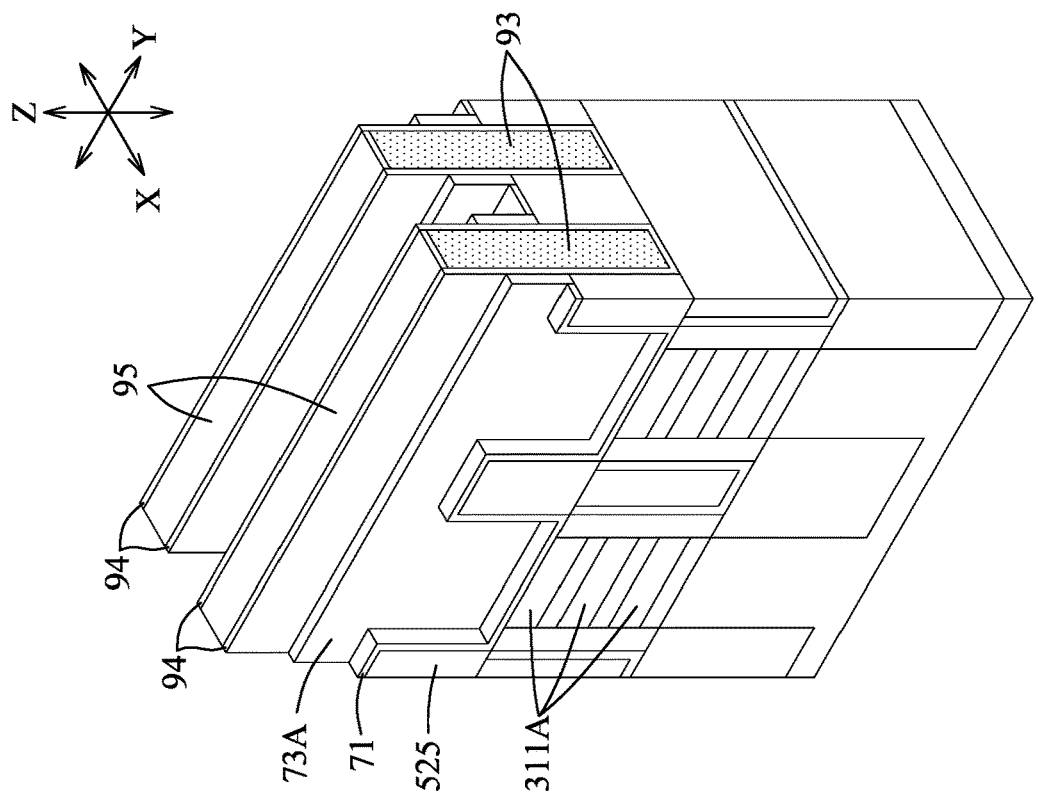

Referring to FIG. 1B and the examples illustrated in FIGS. 14B and 15, the method proceeds to step 114, where the dummy gate 72 of each of the gate structures 7 is removed to expose the dummy dielectric 71. For better understanding, FIGS. 15 to 21A illustrate structures subsequent to the structure shown in FIG. 14B (i.e., after step 113).

The dummy gate 72 may be removed using an etching process. The etching process may be, for example, but not limited to, dry etching, wet etching, or the like. The etching process selectively removes the dummy gate 72 with respect to the dummy dielectric 71. For example, the etching process implements an etchant that has a high etch selectivity for silicon (i.e., the dummy gate 72) compared to silicon oxide (i.e., the dummy dielectric 71) so that the dummy dielectric 71 is not or is not substantially removed during removal of the dummy gate 72. In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve selective removal of the dummy gate 72. Other suitable processes for removal of the dummy gate 72 are within the contemplated scope of the present disclosure.

In some embodiments, as shown in FIG. 15, after removal of the dummy gates 72, the remaining gate spacers 73' may be etched back using, for example, a dry etching process, a wet etching process, other suitable processes, or combinations thereof. Thereafter, the etch-back gate spacers are denoted by the numeral 73A.

Figure 16:
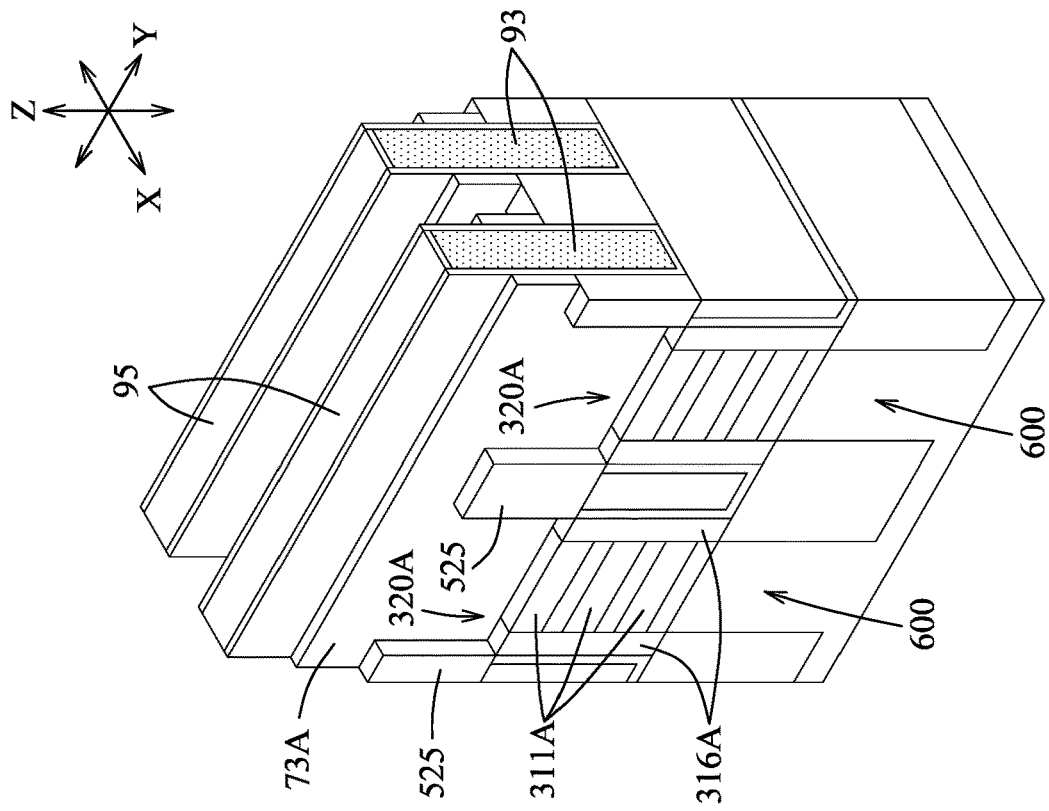

Referring to FIG. 1B and the examples illustrated in FIGS. 15 and 16, the method proceeds to step 115, where the dummy dielectric 71 of each of the gate structures 7 is removed to expose partially the upper surface of the uppermost one of the first nanosheet segments 311A, the isolation elements 525, and remaining regions of the sacrificial bodies 316A.

The dummy dielectric 71 may be removed using an etching process. The etching process may be, for example, but not limited to, dry etching, wet etching, or the like. The etching process selectively removes the dummy dielectric 71 with respect to other features of the structure shown in FIG. 15 (e.g., the first nanosheet segments 311A, the gate spacers 73A, etc.). The etching process implements an etchant that has a high etch selectivity for the dummy dielectric 71 compared to the other features of the structure shown in FIG. 15 so that the other features of the structure are not or are not substantially removed during removal of the dummy dielectric 71. In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve selective removal of the dummy dielectric 71. Other suitable processes for removal of the dummy dielectric 71 are within the contemplated scope of the present disclosure.

By performing the aforementioned steps 114 and 115, a portion of each of the gate structures 7 is removed to form an upper cavity 320A above a corresponding one of the semiconductor structures 600.

Figure 17:
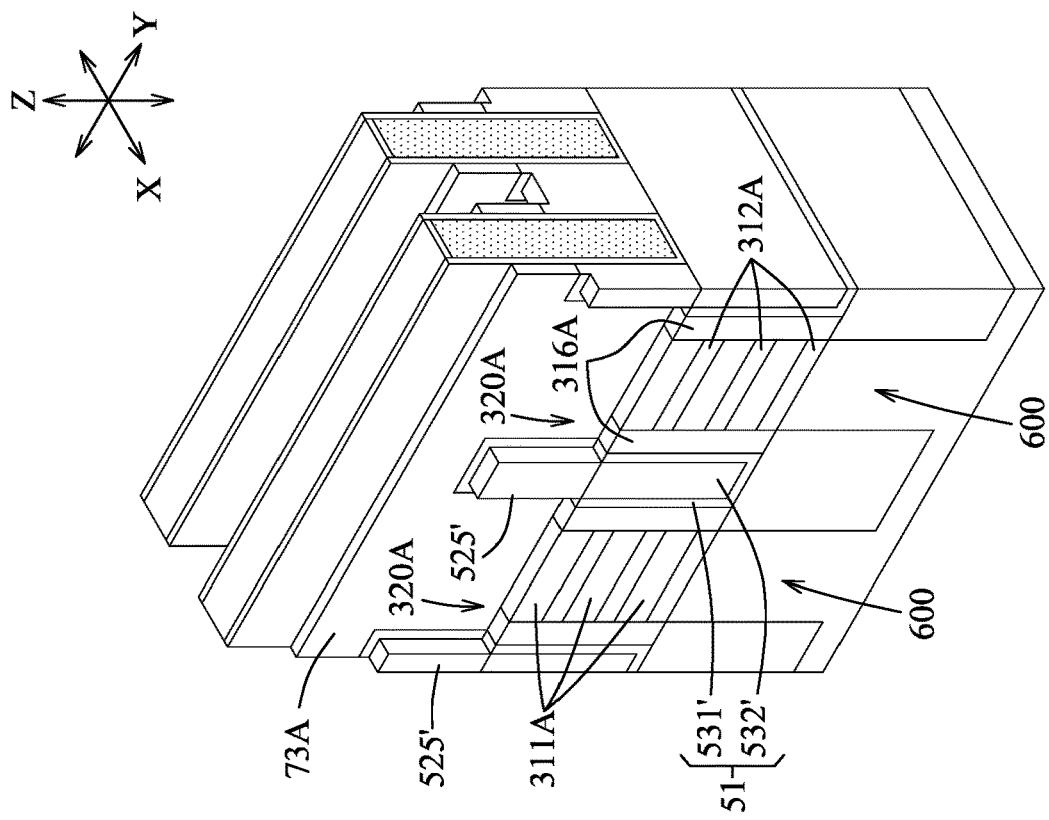

Referring to FIG. 1B and the examples illustrated in FIGS. 16 and 17, the method proceeds to step 116, where the isolation elements 525, which are exposed from the gate spacers 73A, are trimmed (i.e., etched back in both the Y and Z directions) to expose portions of the upper surfaces of the isolation bodies 51, respectively. The remaining isolation elements are denoted by the numeral 525'. In some embodiments, after step 116, the upper surfaces of the remaining parts 531' of the isolation bodies 51 are exposed.

In some embodiments, the trimming of the isolation elements 525 in step 116 may be performed using an etching process such as, for example, but not limited to, a dry etching process, a wet etching process, or the like, or combinations thereof. The etching process selectively removes portions of the isolation elements 525 with respect to other features of the structure shown in FIG. 16 (e.g., the first nanosheet segments 311A, the gate spacers 73A, the masking layers 95, etc.). The etching process implements an etchant that has a high etch selectivity for the isolation elements 525 compared to the other features of the structure shown in FIG. 16 so that the other features of the structure are not or are not substantially removed during removal of the portions of the isolation elements 525. In some embodiments, the etching process may use any suitable etch gas delivered by a suitable carrier gas. In certain embodiments, the etching process implements an etch mask that covers portions of the isolation elements 525 which are to be remained (i.e., the remaining isolation elements 525'). The remaining isolation elements 525' are disposed to cover the remaining parts 532', respectively. The etching process may use a solution containing a wet etchant (i.e., a wet etchant solution). The wet etchant solution may include $NH_4OH$, $H_2SO_4$, $H_2O_2$, HCl, $H_2O$, HF, $HNO_3$, diluted HF, $O_3$, $H_3PO_4$, or the like, or combinations thereof. Other suitable processes for trimming the isolation elements 525 are within the contemplated scope of the present disclosure. Parameter(s) of the removal process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve trimming of the isolation elements 525.

In some embodiments, each of the remaining isolation elements 525' has a rectangular or a square configuration (i.e., upper and lower surfaces of each of the remaining isolation elements 525' have substantially the same dimension, and projections thereof are overlapped in the Z direction). In some other embodiments, in each of the remaining isolation elements 525', the upper surface has a dimension smaller than that of the lower surface (for example, the upper surface has a length in the Y direction that is about 0.5 nm to about 1.5 nm shorter than that of the lower surface). The lower surfaces of the remaining isolation elements 525' are in contact with the upper surfaces of the remaining parts 532' of the isolation bodies 51, respectively. The trimming of the isolation elements 525 is advantageous for forming a metal gate structure(s) in later steps of the method (i.e., after trimming the isolation elements 525, a space for forming the metal gate structure(s) may have an enlarged volume).

Figure 18:
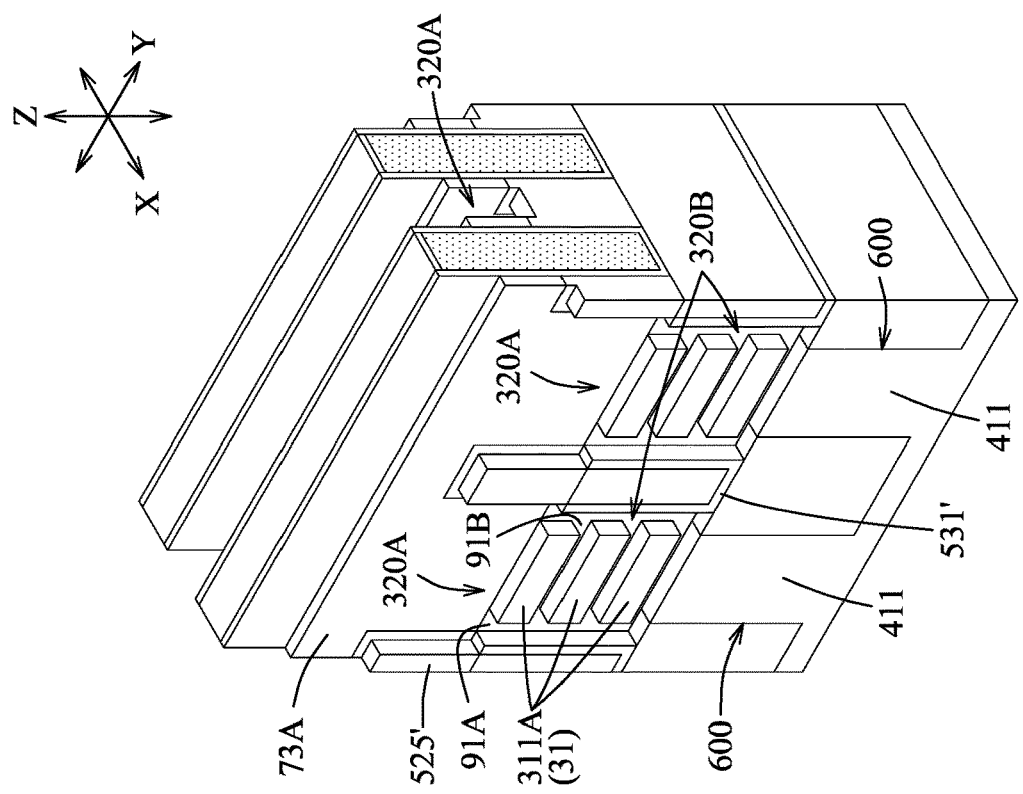

Referring to FIG. 1B and the examples illustrated in FIGS. 17 and 18, the method proceeds to step 117, where the remaining regions of the sacrificial bodies 316A and remaining regions of the second nanosheet segments 312A in each of the semiconductor structures 600 are removed through the upper cavity 320A so as to form a lower cavity 320B. The first nanosheet segments 311A, the vertical regions 91A, the horizontal regions 91B, and parts of the substrate segments 411 located under the first nanosheet segments 311A of each of the semiconductor structures 600 are exposed. The first nanosheet segments 311A in each of the semiconductor structures 600 serve as a channel portion 31 of the device 200 shown in FIG. 21A.

In some embodiments, step 117 may include the following sub-steps: (i) removing the remaining regions of the sacrificial bodies 316A, and (ii) removing the remaining regions of the second nanosheet segments 312A. In certain embodiments, prior to the sub-steps (i) and (ii) of step 117, a cleaning process may be performed using, for instance, hot deionized water, followed by removal of any undesired oxide on surfaces of the structure shown in FIG. 17. In some embodiments, sub-steps (i) and (ii) of step 117 may be performed using an etching process such as, for example, but not limited to, a dry etching process, or the like, or combinations thereof. The etching process selectively removes the remaining regions of the sacrificial bodies 316A and the remaining regions of the second nanosheet segments 312A with respect to other features of the structure shown in FIG. 17 (e.g., the first nanosheet segments 311A, the gate spacers 73A, etc.). The etching process implements an etchant that has a high etch selectivity for the remaining regions of the sacrificial bodies 316A and the remaining regions of the second nanosheet segments 312A compared to the other features of the structure so that the other features of the structure are not or are not substantially removed during step 117. In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve removal of remaining regions of the sacrificial bodies 316A and remaining regions of the second nanosheet segments 312A. Other suitable processes for removal of the remaining regions of the sacrificial bodies 316A and the remaining regions of the second nanosheet segments 312A are within the contemplated scope of the present disclosure.

Figure 21A:
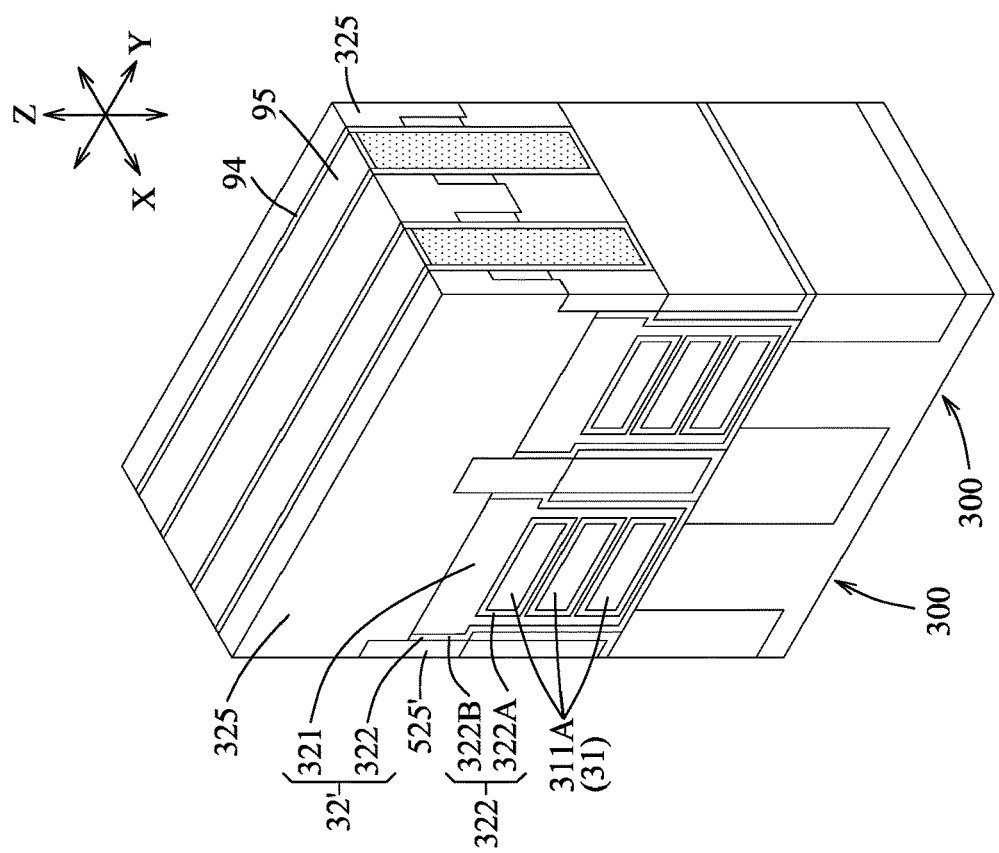
Figure 21C:
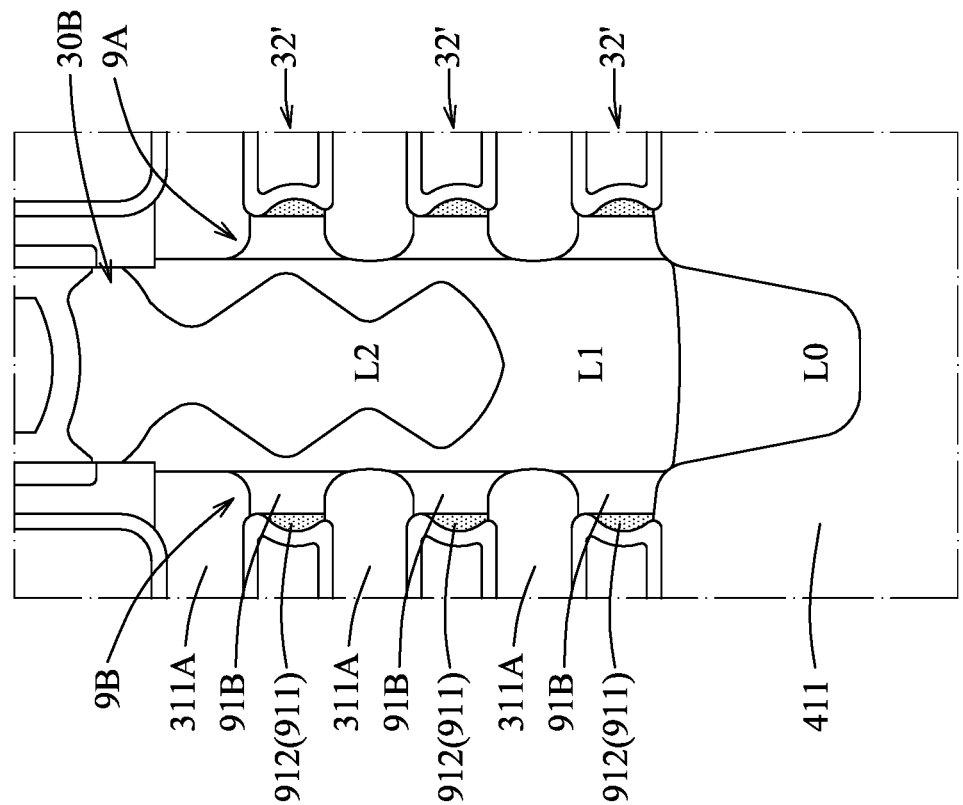
Figure 21B:
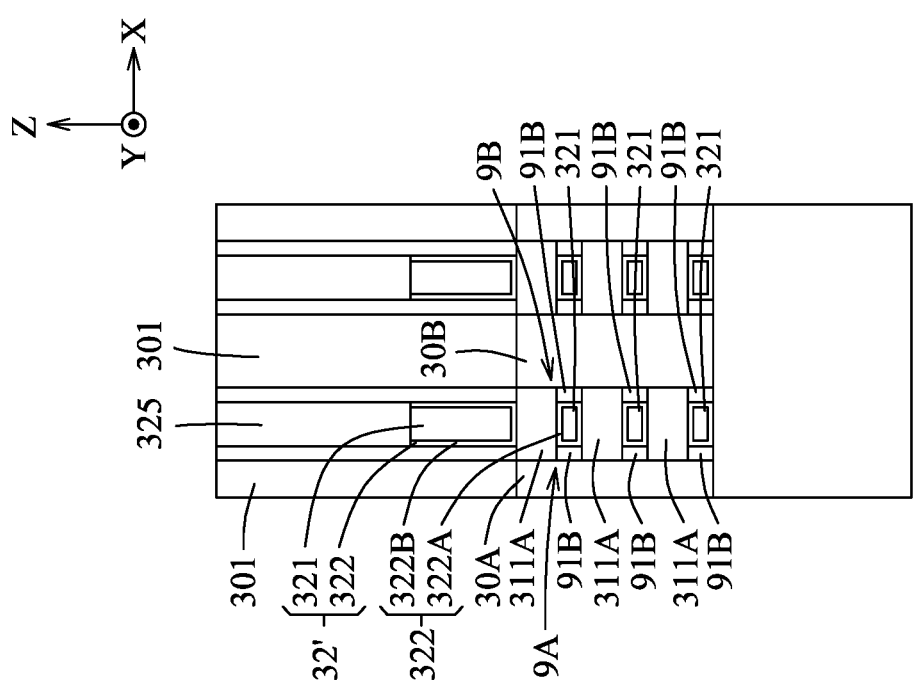

In some embodiments, when the first treatment in step 111 is not performed, after sub-step (ii), step 117 further includes a sub-step (iii) of performing a second treatment to permit each of the first and second inner spacer portions 9A, 9B to have a carbon-rich region 911 (see FIG. 21B, 21C). The second treatment implants carbon into the first and second inner spacer portions 9A, 9B through the upper and lower cavities 320A, 320B. The sub-step (iii) of step 117 (i.e., the second treatment) has similar effect as that of the sub-step (ii) of step 111 (i.e., the first treatment). That is, the carbon-rich region 911 has a carbon atomic concentration higher than that of a remaining region of each of the first and second inner spacer portions 9A, 9B by not less than 0% and not greater than about 25%. In addition, the carbon-rich region 911 has a dielectric constant lower than that of the remaining region by not less than 0 and not greater than about 0.8. To avoid damage of the first and second source/drain portions 30A, 30B, the carbon-rich region 911 formed in step 117 may have a thickness ranging from about 0.5 nm to about 5 nm. Both the sub-step (ii) of step 111 and sub-step (iii) of step 117 are effective to permit each of the first and second inner spacer portions 9A, 9B to have the carbon-rich region 911. According to different applications, in some embodiments, one of the sub-step (ii) of step 111 and sub-step (iii) of step 117 is performed, while in other embodiments, both sub-steps (ii) and (iii) are performed. For instance, sub-step (iii) of step 117 (the second treatment) may be used to recover carbon content of the first and second inner spacer portions 9A, 9B.

The second treatment (i.e., a carbon implantation treatment) may be one of a plasma treatment or a chemical soaking treatment. In some embodiments, the plasma treatment is used so that the carbon implantation may be conducted at a relatively lower temperature, such as ranging from about 100° C. to about 300° C. In some other embodiments, the chemical soaking treatment may be conducted at a temperature ranging from about 500° C. to about 700° C. Other suitable carbon implantation treatments are within the contemplated scope of the present disclosure. In some embodiments, a precursor for implanting carbon includes at least one of methane ($CH_4$), ethane ($C_2H_6$), propane ($C_3H_8$), ethene ($C_2H_4$), propylene ($C_3H_6$), ethyne ($C_2H_2$), and propyne ($C_3H_4$). Such carbon-containing species provide carbon to bond with suitable species in the vertical regions 91A and the horizontal regions 91B, thereby forming chemical bonds such as Si—C—O, Si—C—N, Si—$CH_3$, Si—$CO_2$, but not limited thereto. In some embodiments, a dosage amount of carbon present for the plasma may range from about $1 \times 10^{15}$ atom/$cm^3$ to about $2 \times 10^{17}$ atom/$cm^3$. The plasma may also include any other suitable species, such as $SiH_4$, Ar, Xe, $H_2$, $N_2$, He, $O_2$, or combinations thereof. Other suitable precursors and/or species for the second treatment are within the contemplated scope of the present disclosure. In some embodiments, a DC Bias voltage ranging from about 200 eV to about 10 kV may be applied for the second treatment. In contrast to the first treatment in sub-step (ii) of step 111, the second treatment in step 117 may increase carbon atomic concentration of the region and/or the surface of each of the vertical regions 91A and the horizontal regions 91B at a side opposite to a corresponding one of the first and second source/drain portions 30A, 30B according to practical needs. In addition, the second treatment in step 117 may selectively implant carbon into the vertical regions 91A and the horizontal regions 91B instead of other features of the structure such as the first nanosheet segments 311A because of the relatively lower density of the material of the vertical regions 91A and the horizontal regions 91B than that of the other features of the structure.

In some embodiments, after sub-step (iii), a portion of the first nanosheet segments 311A may be removed by, e.g., trimming, so as to reduce the thickness thereof along the Z direction, or in some cases, to remove impurities on surface thereof. The trimming process may be a dry etching process, or a chemical etching process. Other suitable processes for trimming the first nanosheet segments 311A are within the contemplated scope of the present disclosure. In a dry etching process, chemicals such as $CF_4$, $CHF_3$, $CH_3F$, $SO_2$, $O_2$, Ar, He, $N_2$ or $H_2$ may be used. In a chemical etching process, chemicals such as $NH_3$, $F_2$, HF, $N_2$, $H_2$ may be used. Other suitable chemicals and processes for trimming the first nanosheet segments 311A are within the contemplated scope of the present disclosure. It is noted that in the trimming process, inner spacers having a higher carbon atomic concentration is less affected (i.e., less amount of the inner spacer is being etched away).

After trimming of the first nanosheet segments 311A, each of the first nanosheet segments 311A in the lower cavity 320B may have a thickness in the Z direction and a length in the Y direction according to application requirements.

Figure 19:
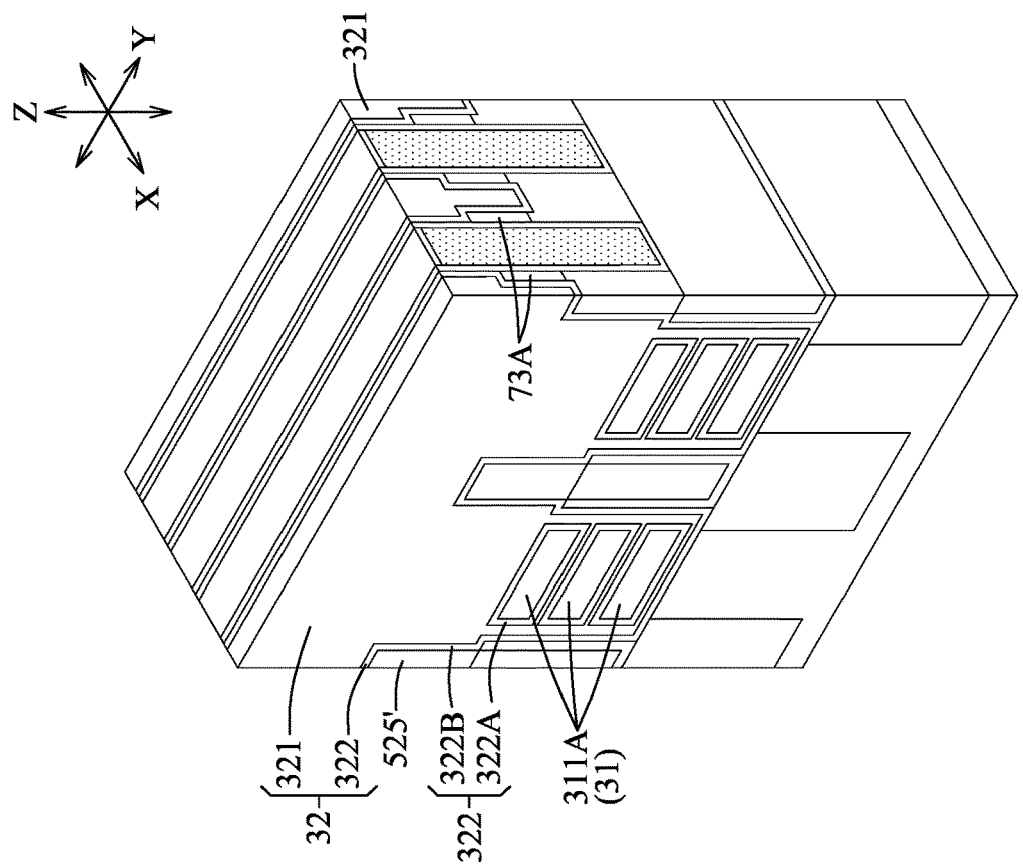

Referring to FIG. 1B and the examples illustrated in FIGS. 18 and 19, the method proceeds to step 118, where metal gate structures 32 are each formed in the upper and lower cavities 320A, 320B of a corresponding one of the semiconductor structures 600 to surround the channel portion 31 (i.e., surrounding the first nanosheet segments 311A). In addition, the metal gate structures 32 are each in contact with corresponding ones of the vertical regions 91A, corresponding ones of the horizontal regions 91B, and corresponding ones of the exposed parts of the substrate segments 411 in step 117, corresponding ones of the exposed surfaces of the remaining parts 531' in step 117, corresponding ones of the remaining isolation elements 525', and corresponding ones of the gate spacers 73A. The metal gate structures 32 may each include a gate electrode 321 and a gate dielectric 322 having a first dielectric region 322A that is disposed to separate the gate electrode 321 from the first nanosheets 311, and a second dielectric region 322B that is disposed to separate the gate electrode 321 from the first and second source/drain portions 30A, 30B (see also FIG. 13B) in the X direction.

In some embodiments, step 118 may include the following sub-steps: (i) conformally forming a gate dielectric layer for forming the gate dielectric 322 over the structure shown in FIG. 18, (ii) forming a gate electrode layer for forming the gate electrode 321 on the gate dielectric layer to fully fill the upper and lower cavities 320A, 320B in each of the semiconductor structures 600, and (iii) performing a planarization process to remove excess portions of the gate dielectric layer and the gate electrode layer so as to form the metal gate structures 32. The gate dielectric layer and the gate electrode layer may each be formed using a deposition process, such as ALD, CVD, PVD, or the like, or combinations thereof. The planarization process may be, for example, CMP, or the like, but not limited thereto. Other suitable processes for forming the metal gate structures 32 are within the contemplated scope of the present disclosure.

The gate dielectric layer includes a high-k dielectric material such as, for example, but not limited to, Hf-based dielectric materials, Zr-based dielectric materials, Al-based dielectric materials, Ti-based dielectric materials, Ba-based dielectric materials, RE element-based dielectric materials, nitrides, or the like, or combinations thereof. The gate electrode layer includes a conductive material such as, for example, but not limited to, a metal (e.g., copper, aluminum, titanium, tantalum, cobalt, tungsten, or the like, or alloys thereof), polysilicon, metal-containing nitrides (e.g., TaN), metal-containing silicides (e.g., NiSi), metal-containing carbides (e.g., TaC), or the like, or combinations thereof. Other suitable materials for forming the gate dielectric layer and the gate electrode layer are within the contemplated scope of the present disclosure.

Figure 20:
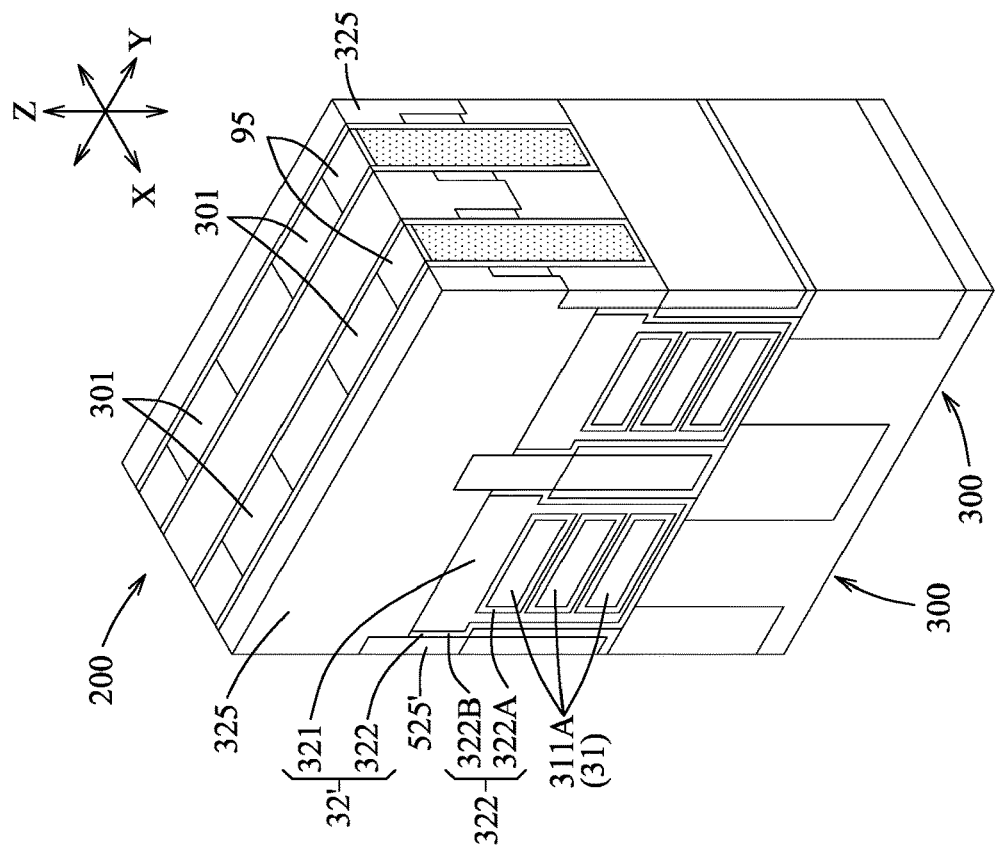

Referring to FIG. 1B and the examples illustrated in FIGS. 19 and 20, the method proceeds to step 119, where a portion of the gate electrode 321 and a portion of the gate dielectric 322 of each of the metal gate structures 32 are removed. In some embodiments, in step 119, an upper portion (i.e., the portion of the gate electrode 321 and the portion of the gate dielectric 322) of each of the metal gate structures 32 is replaced with a self-aligned contact (SAC) 325. After step 119, remaining metal gate structures may be referred to as gate portions 32' of the device 200 shown in FIG. 21A. As such, each of the gate portions 32' is formed in the upper and lower cavities 320A, 320B of a corresponding one of the semiconductor structures 600 (see FIG. 18) to surround each of the first nanosheet segments 311A. After step 119, the semiconductor structures 600 are formed into the semiconductor units 300 each including (i) one of the gate portions 32', (ii) the first source/drain portion 30A and the second source/drain portion 30B which are at two opposite sides of the one of the gate portions 32', (iii) the first nanosheet segments 311A of a corresponding one of the semiconductor structures 600 which are surrounded by the one of the gate portions 32', and (iv) the first and second inner spacer portions 9A, 9B which are disposed to separate the one of the gate portions 32' from the first and second source/drain portions 30A, 30B.

Removal of the portion of the gate electrode 321 and the portion of the gate dielectric 322 may be performed using an etching process such as, for example, but not limited to, a dry etching process, or the like, or combinations thereof. The etching process selectively removes the portion of the gate electrode 321 and the portion of the gate dielectric 322 with respect to other features of the structure shown in FIG. 19 (e.g., the isolation elements 525', etc.). The etching process implements an etchant that has a high etch selectivity for the portion of the gate electrode 321 and the portion of the gate dielectric 322 compared to the other features of the structure so that the other features of the structure are not or are not substantially removed during removal of the portion of the gate electrode 321 and the portion of the gate dielectric 322. In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve selective removal of the portion of the gate electrode 321. Other suitable processes for removal of the portion of the gate electrode 321 and the portion of the gate dielectric 322 are within the contemplated scope of the present disclosure.

The SAC 325 may be formed using a deposition process such as, for example, but not limited to, ALD, CVD, PVD, plating, or the like, or combinations thereof. After forming the SAC 325, a planarization process, such as CMP, or the like, may be performed to remove an excess of the SAC 325. Other processes suitable for forming the SAC 325 are within the contemplated scope of the present disclosure.

The SAC 325 may include a low-k dielectric material with a dielectric constant (k) of not greater than about 7, for example, but not limited to, silicon oxide (e.g., $SiO_2$), silicon nitride, silicon carbide, boron nitride, boron carbide, or the like, or combinations thereof. In some embodiments, the low-k dielectric material in the SAC 325 may have a dielectric constant (k) of not greater than about 5. Other materials suitable for the SAC 325 are within the contemplated scope of the present disclosure.

Referring to FIG. 1B and the examples illustrated in FIGS. 21A and 21B, the method proceeds to step 120, where source/drain contacts 301 are formed to contact with a corresponding one of the first and second source/drain portions 30A, 30B. After step 120, the device 200 is obtained. FIG. 21A is a fragmentary perspective cross-sectional view of the device 200 formed with the source/drain contacts 301 in accordance with some embodiments of the present disclosure. FIG. 21B is a cross-sectional view similar to that of FIG. 13B but illustrating the device 200 obtained in step 120 in accordance with some embodiments of the present disclosure.

The source/drain contacts 301 may be formed using an etching process and/or a lithography process. In some embodiments, a patterned mask layer is formed on the structures shown in FIG. 20 using a lithography process. The patterned mask layer is used in the etching process for forming source/drain contact openings, each of which extends through a corresponding one of the masking layers 95, a corresponding one of the ILD layers 93, and a corresponding one of the CESLs 94 to expose a corresponding one of the first and second source/drain portions 30A, 30B of the semiconductor units 300. The etching process may be, for example, but not limited to, a dry etching process, a wet etching process, or the like. To form the source/drain contacts 301, a conductive material is filled in the source/drain contact openings, followed by removing an excess of the conductive material. The conductive material may be, for example, but not limited to, copper, tungsten, cobalt, ruthenium, aluminum, palladium, nickel, platinum, a low resistivity metal constituent, or the like, or combinations thereof. The conductive material may be filled in the source/drain contact openings using a deposition process, such as, for example, but not limited to, ALD, CVD, PVD, plating, or the like. Removal of the excess of the conductive material may be, for example, but not limited to, a planarization process, such as CMP, or the like. The planarization process is performed to expose the masking layers 95.

Figure 21D:
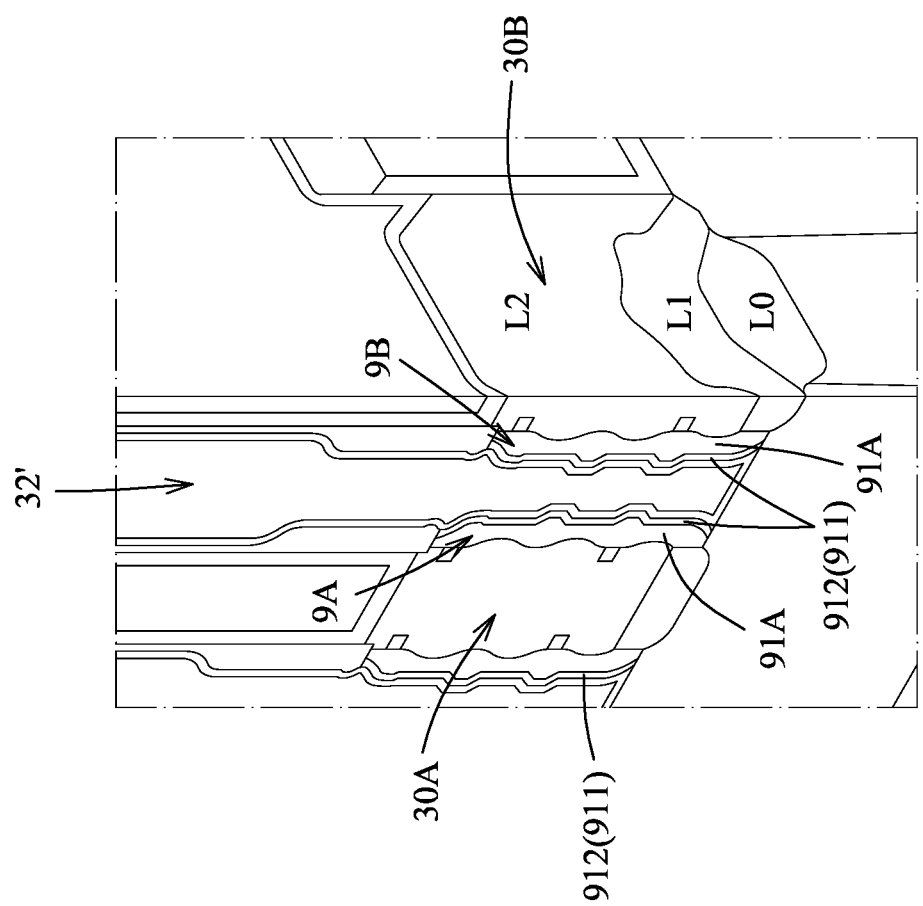

FIG. 21C is an enlarged cross-sectional view of FIG. 21A illustrating the horizontal regions 91B of the first and second inner spacer portions 9A, 9B in accordance with some embodiments. FIG. 21D is an enlarged perspective cross-sectional view of FIG. 21A illustrating the vertical regions 91A of the first and second inner spacer portions 9A, 9B in accordance with some embodiments.

In the device 200, the isolation structures 5 are disposed to alternate with the semiconductor units 300. In each of the semiconductor units 300 of the device 200, the first and second inner spacer portions 9A, 9B are disposed to separate the gate portion 32' from the first and second source/drain portions 30A, 30B, respectively. The first inner spacer portion 9A is disposed between the gate portion 32' and the first source/drain portion 30A to surround the first end regions of the nanosheet segments 311A, and the second inner spacer portion 9B is disposed between the gate portion 32' and the second source/drain portion 30B to surround the second end regions of the nanosheet segments 311A. Each of the horizontal regions 91B and the vertical regions 91A has a carbon-rich zone 912 that confronts the gate portion 32'. In each of the first and second inner spacer portions 9A, 9B, the carbon-rich zones 912 of the horizontal regions 91B and the vertical regions 91A together constitute the carbon-rich region 911.

It should be noted that some steps in the method may be modified, replaced, or eliminated without departure from the spirit and scope of the present disclosure, and those steps may not be in the order mentioned above. In alternative embodiments, other suitable methods may also be applied for forming the device 200.

In some alternative embodiments, the device 200 may further include additional features, and/or some features present in the device 200 may be modified, replaced, or eliminated without departure from the spirit and scope of the present disclosure.

The embodiments of the present disclosure have the following advantageous features. By including a carbon-rich region in the inner spacer, the inner spacer is strengthened, for instance, a higher etching resistance, so as to withstand any unintentional damage throughout manufacture of the device. For example, during formation of source/drain portions, or formation of metal gate, reduced carbon atomic concentration of the inner spacer would reduced strength thereof, which would result in the inner spacers being easily broken. In addition, by virtue of including the carbon-rich region, dielectric constant of the inner spacer is effectively reduced, which is conducive to lowering capacitance of the resultant device, and thereby enhancing performance, e.g., a higher device frequency while not affecting electric leakage level of the device. The present disclosure also provides different approaches performed at different stage of the method to obtain the carbon-rich region in the inner spacer.

In accordance with some embodiments of the present disclosure, a device includes at least one semiconductor unit which includes a first source/drain portion, a second source/drain portion, at least one nanosheet segment which is disposed to interconnect the first and second source/drain portions, a gate portion disposed around the at least one nanosheet segment, and a first inner spacer portion and a second inner spacer portion which are disposed to separate the gate portion from the first and second source/drain portions, respectively. Each of the first and second inner spacer portions has a carbon-rich region which confronts the gate portion.

In accordance with some embodiments of the present disclosure, the carbon-rich region has a thickness ranging from 0.5 nm to 8 nm.

In accordance with some embodiments of the present disclosure, each of the first and second inner spacer portions further has a remaining region which is opposite to the carbon-rich region and which confronts a corresponding one of the first and second source/drain portions. The carbon-rich region has a carbon atomic concentration higher than that of the remaining region.

In accordance with some embodiments of the present disclosure, the carbon atomic concentration of the carbon-rich region is higher than that of the remaining region by not less than 0% and not greater than 25%.

In accordance with some embodiments of the present disclosure, the carbon-rich region has a dielectric constant lower than that of the remaining region by not less than 0 and not greater than 0.8.

In accordance with some embodiments of the present disclosure, the at least one semiconductor unit includes a plurality of the nanosheet segments which are spaced apart from each other and which respectively interconnect the first and second source/drain portions so as to permit the gate portion to surround each of the nanosheet segments.

In accordance with some embodiments of the present disclosure, each of the nanosheet segments has a first end region and a second end region which are disposed to be in contact with the first and second source/drain portions, respectively. The first inner spacer portion is disposed between the gate portion and the first source/drain portion to surround the first end regions of the nanosheet segments. The second inner spacer portion is disposed between the gate portion and the second source/drain portion to surround the second end regions of the nanosheet segments.

In accordance with some embodiments of the present disclosure, the device includes a plurality of the semiconductor units and a plurality of isolation structures which are disposed to alternate with the semiconductor units. Each of the first and second inner spacer portions includes a plurality of horizontal regions and a plurality of vertical regions. Each of the horizontal regions is disposed between the first end regions or the second end regions of two adjacent ones of the nanosheet segments, and has a carbon-rich zone that confronts the gate portion. Each of the vertical regions is disposed to interconnect the horizontal regions with a corresponding one of the isolation structures, and has a carbon-rich zone that confronts the gate portion. The carbon-rich zones of the horizontal regions and the vertical regions together constitute the carbon-rich region.

In accordance with some embodiments of the present disclosure, the gate portion includes a gate electrode and a gate dielectric. The gate dielectric has a plurality of first dielectric regions and a second dielectric region. Each of the first dielectric regions is disposed to separate the gate electrode from a corresponding one of the nanosheet segments. The second dielectric region is disposed to separate the gate electrode from the first and second inner spacer portions.

In accordance with some embodiments of the present disclosure, each of the first and second inner spacer portions includes a dielectric material which includes at least one of silicon, carbon, oxygen, nitrogen, fluorine, and boron.

In accordance with some embodiments of the present disclosure, a method for manufacturing a device includes: forming at least one first nanosheet segment and at least one second nanosheet segment alternating with the at least one first nanosheet segment; forming a gate structure over the first and second nanosheet segments such that a first end region of each of the first and second nanosheet segments is exposed from a first source/drain recess, and such that a second end region of each of the first and second nanosheet segments is exposed from a second source/drain recess; removing the first end region and the second end region of the second nanosheet segments to form a first lateral recess and a second lateral recess, respectively; forming a first inner spacer portion to fill the first lateral recess, and forming a second inner spacer portion to fill the second lateral recess; performing a treatment to permit each of the first and second inner spacer portions to have a carbon-rich region; forming a first source/drain portion and a second source/drain portion respectively in the first and second source/drain recesses; removing a portion of the gate structure to form an upper cavity; removing a remaining region of the second nanosheet segment through the upper cavity so as to form a lower cavity; and forming a gate portion in the upper and lower cavities.

In accordance with some embodiments of the present disclosure, the treatment is performed before forming the gate portion and after formation of the upper and lower cavities.

In accordance with some embodiments of the present disclosure, the treatment is performed by implanting carbon into the first and second inner spacer portions through the upper and lower cavities such that after formation of the gate portion, the carbon-rich region is located to confront the gate portion.

In accordance with some embodiments of the present disclosure, a precursor for implanting carbon includes at least one of methane ($CH_4$), ethane ($C_2H_6$), propane ($C_3H_8$), ethene ($C_2H_4$), propylene ($C_3H_6$), ethyne ($C_2H_2$), and propyne ($C_3H_4$).

In accordance with some embodiments of the present disclosure, the treatment is performed during formation of the first and second inner spacer portions.

In accordance with some embodiments of the present disclosure, forming the first and second inner spacer portions includes forming a spacer layer to cover the gate structure and inner surfaces of the first and second source/drain recesses to fill the first and second lateral recesses, and selectively removing the spacer layer to leave the first and second inner spacer portions respectively in the first and second lateral recesses. The treatment is performed after forming the spacer layer and before selectively removing the spacer layer such that after formation of the gate portion, the carbon-rich region is located to confront the gate portion.

In accordance with some embodiments of the present disclosure, the spacer layer includes silicon, carbon, and at least one of oxygen, nitrogen, fluorine, and boron.

In accordance with some embodiments of the present disclosure, forming the first and second inner spacer portions further includes, before selectively removing the spacer layer, annealing the spacer layer, and the treatment is performed before annealing the spacer layer and is applied to an outer surface portion of the spacer layer so as to permit carbon atoms in the spacer layer to diffuse into an inner surface portion of the spacer layer.

In accordance with some embodiments of the present disclosure, the treatment is a radical treating process, a plasma treating process, or a microwave treating process.

In accordance with some embodiments of the present disclosure, a method includes forming a plurality of first nanosheet segments, a plurality of second nanosheet segments alternating with the first nanosheet segments, and sacrificial bodies at opposite sides of a stack including the first and second nanosheet segments; forming a gate structure over the first and second nanosheet segments and the sacrificial bodies such that a first end region of each of the first and second nanosheet segments and the sacrificial bodies is exposed from a first source/drain recess, and such that a second end region of each of the first and second nanosheet segments and the sacrificial bodies is exposed from a second source/drain recess; removing the first and second end regions of the sacrificial bodies to form first and second inner gaps, respectively; removing the first end regions and the second end regions of the second nanosheet segments to form first lateral recesses and second lateral recesses, respectively; forming a first inner spacer portion to fill the first inner gaps and the first lateral recesses, and forming a second inner spacer portion to fill the second inner gaps and the second lateral recesses; performing a treatment to permit each of the first and second inner spacer portions to have a carbon-rich region; forming a first source/drain portion and a second source/drain portion respectively in the first and second source/drain recesses; removing a portion of the gate structure to form an upper cavity; removing remaining regions of the second nanosheet segments through the upper cavity so as to form a lower cavity; and forming a gate portion in the upper and lower cavities to permit the gate portion to surround each of the first nanosheet segments.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a device, comprising:
    forming a first nanosheet segment and a second nanosheet segment alternating with the first nanosheet segment;
    forming a gate structure over the first nanosheet segment and the second nanosheet segment such that a first end region of each of the first nanosheet segment and the second nanosheet segment is exposed from a first source/drain recess, and such that a second end region of each of the first nanosheet segment and the second nanosheet segment is exposed from a second source/drain recess;
    removing the first end region and the second end region of the second nanosheet segment to form a first lateral recess and a second lateral recess, respectively;
    forming a first inner spacer portion to fill the first lateral recess, and forming a second inner spacer portion to fill the second lateral recess;
    performing a treatment to permit each of the first inner spacer portion and the second inner spacer portion to have a carbon-rich region;
    forming a first source/drain portion and a second source/drain portion respectively in the first source/drain recess and the second source/drain recess;
    removing a portion of the gate structure to form an upper cavity;
    removing a remaining region of the second nanosheet segment through the upper cavity so as to form a lower cavity; and forming a gate portion in the upper cavity and the lower cavity.

2. The method according to claim 1, wherein the treatment is performed before forming the gate portion and after formation of the upper cavity and the lower cavity.

3. The method according to claim 2, wherein the treatment is performed by implanting carbon into the first inner spacer portion and the second inner spacer portion through the upper cavity and the lower cavity such that after formation of the gate portion, the carbon-rich region is located to confront the gate portion.

4. The method according to claim 3, wherein a precursor for implanting carbon includes at least one of methane ($CH_4$), ethane ($C_2H_6$), propane ($C_3H_8$), ethene ($C_2H_4$), propylene ($C_3H_6$), ethyne ($C_2H_2$), and propyne ($C_3H_4$).

5. The method according to claim 1, wherein the treatment is performed during formation of the first inner spacer portion and the second inner spacer portion.

6. The method according to claim 5, wherein:
forming the first inner spacer portion and the second inner spacer portion includes
forming a spacer layer to cover the gate structure and inner surfaces of the first source/drain recess and the second source/drain recess to fill the first lateral recess and the second lateral recess, and
selectively removing the spacer layer to leave the first inner spacer portion and the second inner spacer portion respectively in the first lateral recess and the second lateral recess; and
the treatment is performed after forming the spacer layer and before selectively removing the spacer layer such that after formation of the gate portion, the carbon-rich region is located to confront the gate portion.

7. The method according to claim 6, wherein the spacer layer includes silicon, carbon, and at least one of oxygen, nitrogen, fluorine, and boron.

8. The method according to claim 6, wherein:
forming the first inner spacer portion and the second inner spacer portion further includes, before selectively removing the spacer layer, annealing the spacer layer; and
the treatment is performed before annealing the spacer layer and is applied to an outer surface portion of the spacer layer so as to permit carbon atoms in the spacer layer to diffuse into an inner surface portion of the spacer layer.

9. The method according to claim 8, wherein the treatment is a radical treating process, a plasma treating process, or a microwave treating process.

10. A method for manufacturing a device, comprising:
forming first nanosheet segments, second nanosheet segments alternating with the first nanosheet segments, and sacrificial bodies at opposite sides of a stack including the first nanosheet segments and the second nanosheet segments;
forming a gate structure over the first nanosheet segments, the second nanosheet segments and the sacrificial bodies such that a first end region of each of the first nanosheet segments, the second nanosheet segments and the sacrificial bodies is exposed from a first source/drain recess, and such that a second end region of each of the first nanosheet segments, the second nanosheet segments and the sacrificial bodies is exposed from a second source/drain recess;
removing the first end region and the second end region of the sacrificial bodies to form first inner gaps and second inner gaps, respectively;
removing the first end regions and the second end regions of the second nanosheet segments to form first lateral recesses and second lateral recesses, respectively;
forming a first inner spacer portion to fill the first inner gaps and the first lateral recesses, and forming a second inner spacer portion to fill the second inner gaps and the second lateral recesses;
performing a treatment to permit each of the first inner spacer portion and the second inner spacer portion to have a carbon-rich region;
forming a first source/drain portion and a second source/drain portion respectively in the first source/drain recess and the second source/drain recess;
removing a portion of the gate structure to form an upper cavity;
removing remaining regions of the second nanosheet segments through the upper cavity so as to form a lower cavity; and
forming a gate portion in the upper cavity and the lower cavity to permit the gate portion to surround each of the first nanosheet segments.

11. A method for manufacturing a device, comprising:
forming a nanosheet segment which has a first end region and a second end region opposite to each other;
forming a first inner spacer portion and a second inner spacer portion respectively surrounding the first end region and the second end region;
forming a first source/drain portion and a second source/drain portion that are interconnected by the nanosheet segment;
forming a gate portion around the nanosheet segment, the gate portion being separated from the first source/drain portion and the second source/drain portion by the first inner spacer portion and the second inner spacer portion respectively; and
forming a carbon-rich region in each of the first inner spacer portion and the second inner spacer portion.

12. The method according to claim 11, wherein the carbon-rich region in each of the first inner spacer portion and the second inner spacer portion confronts the gate portion.

13. The method according to claim 12, wherein each of the first inner spacer portion and the second inner spacer portion further has a remaining region which is opposite to the carbon-rich region and which confronts a corresponding one of the first source/drain portion and the second source/drain portion, the carbon-rich region having a carbon atomic concentration higher than a carbon atomic concentration of the remaining region.

14. The method according to claim 13, wherein the carbon atomic concentration of the carbon-rich region is higher than the carbon atomic concentration of the remaining region by not less than 0% and not greater than 25%.

15. The method according to claim 13, wherein the carbon-rich region has a dielectric constant lower than a dielectric constant of the remaining region by not less than 0 and not greater than 0.8.

16. The method according to claim 11, wherein the treatment is performed during formation of the first inner spacer portion and the second inner spacer portion.

17. The method according to claim 16, wherein forming the carbon-rich region includes:
forming a spacer layer over the first end region and the second end region of the nanosheet segment, the spacer layer including carbon;
performing a treatment so that carbon diffuses from an outer surface portion of the spacer layer in a direction away from the outer surface portion, thereby forming the carbon-rich region; and removing excess portions of the spacer layer, so as to form the first inner spacer portion and the second inner spacer portion.

18. The method according to claim 11, wherein the treatment is performed after forming the first source/drain portion and the second source/drain portion.

19. The method according to claim 18, wherein the treatment is a carbon implantation treatment.

20. The method according to claim 11, wherein the carbon-rich region includes at least one of Si—C—O, Si—C—N, Si—CH$_3$, Si—CO$_2$, or combinations thereof.

* * * * *